United States Patent
Feng et al.

(10) Patent No.: US 11,362,375 B2
(45) Date of Patent: *Jun. 14, 2022

(54) SAFETY PREVENTION AND CONTROL SYSTEM AND CONTROL METHOD OF POWER BATTERY PACK FOR ELECTRIC VEHICLE

(71) Applicant: TSINGHUA UNIVERSITY, Beijing (CN)

(72) Inventors: Xuning Feng, Beijing (CN); Xiangming He, Beijing (CN); Li Wang, Beijing (CN); Minggao Ouyang, Beijing (CN); Languang Lu, Beijing (CN); Siqi Zheng, Beijing (CN); Gan Zhang, Beijing (CN); Yue Pan, Beijing (CN)

(73) Assignee: Tsinghua University, Beijing (CN)

( * ) Notice: Subject to any disclaimer, the term of this patent is extended or adjusted under 35 U.S.C. 154(b) by 44 days.

This patent is subject to a terminal disclaimer.

(21) Appl. No.: 16/632,815

(22) PCT Filed: Nov. 6, 2018

(86) PCT No.: PCT/CN2018/114168
§ 371 (c)(1),
(2) Date: Jan. 21, 2020

(87) PCT Pub. No.: WO2019/119997
PCT Pub. Date: Jun. 27, 2019

(65) Prior Publication Data
US 2021/0151808 A1    May 20, 2021

(30) Foreign Application Priority Data
Dec. 18, 2017   (CN) .......................... 201711366401.9

(51) Int. Cl.
*H01M 10/42* (2006.01)
*H01M 10/625* (2014.01)
(Continued)

(52) U.S. Cl.
CPC ...... *H01M 10/4257* (2013.01); *G01R 31/396* (2019.01); *H01M 10/486* (2013.01);
(Continued)

(58) Field of Classification Search
CPC .............. G01R 31/396; H01M 10/425; H01M 10/4257; H01M 10/48; H01M 10/486;
(Continued)

(56) References Cited

U.S. PATENT DOCUMENTS

2012/0034501 A1* 2/2012 Hermann ............ H01M 50/581
429/62
2012/0176080 A1* 7/2012 Uchihashi ................ A62C 3/16
320/101

FOREIGN PATENT DOCUMENTS

CN          106066457 A  * 11/2016  ............. G01R 31/36

OTHER PUBLICATIONS

Machine Translation CN106066457(A) (Year: 2016).*

* cited by examiner

*Primary Examiner* — Victoria H Lynch
(74) *Attorney, Agent, or Firm* — Avek IP, LLC

(57) ABSTRACT

The present application relates to a safety prevention and control system and control method of a power battery pack for an electric vehicle. The safety prevention and control system of a power battery pack includes a signal acquisition device, a main controller, and a step-by-step prevention and control execution device. The main controller includes a fault diagnosis device, a cell thermal runaway determination device and a battery pack thermal runaway propagation (Continued)

determination device, which are respectively electrically connected to the step-by-step prevention and control execution device to send different control instructions to the step-by-step prevention and control execution device. The step-by-step prevention and control execution device can execute prevention and control actions of different levels according to the different control instructions sent by the fault diagnosis device, the cell thermal runaway determination device and the battery pack thermal runaway propagation determination device. The safety prevention and control system of a power battery pack for an electric vehicle can provide an active prevention and control measure and a passive prevention and control measure, and according to the actual situation of a specific accident and the prevention and control ability of the prevention and control system, accurately start a prevention and control mechanism, maximize a safety protection effect, and ensure the safety of an electric vehicle occupant.

17 Claims, 12 Drawing Sheets

(51) Int. Cl.
*H01M 10/63* (2014.01)
*H01M 10/6556* (2014.01)
*H01M 10/6567* (2014.01)
*H01M 10/48* (2006.01)
*G01R 31/396* (2019.01)

(52) U.S. Cl.
CPC ......... *H01M 10/625* (2015.04); *H01M 10/63* (2015.04); *H01M 10/6556* (2015.04); *H01M 10/6567* (2015.04); *H01M 2010/4271* (2013.01); *H01M 2200/10* (2013.01); *H01M 2220/20* (2013.01)

(58) Field of Classification Search
CPC ............... H01M 10/625; H01M 10/63; H01M 10/6556; H01M 10/6567; H01M 2010/4271; H01M 2200/10; H01M 2220/20; Y02E 60/10
See application file for complete search history.

SAFETY PREVENTION AND CONTROL SYSTEM AND CONTROL METHOD OF POWER BATTERY PACK FOR ELECTRIC VEHICLE

CROSS REFERENCE TO RELATED APPLICATIONS

This application is the United States national stage entry under 35 U.S.C. 371 of PCT/CN2018/114168 filed on Nov. 6, 2018, which claims priority to Chinese application number 201711366401.9, filed on Dec. 18, 2017, the disclosure of which are incorporated herein by reference in their entireties.

FIELD OF THE DISCLOSURE

The disclosure relates generally to the field of electric vehicles and batteries. More specifically, the disclosure relates to a safety prevention and control system and control method of a power battery pack for an electric vehicle.

BACKGROUND

Electric vehicles are the mainstay of new energy vehicles, and power batteries are the core energy source for electric vehicles. Power batteries generally need to be grouped to meet the drive needs of electric vehicles. A vehicle power battery pack may be equipped with a safety prevention and control system to ensure the safety of the vehicle power battery pack during use.

Generally, safety accidents of electric vehicles are characterized by multiple stages. The first stage is a fault of a battery system, which forms an inducement for thermal runaway of a battery cell; the second stage is thermal runaway of a battery cell in the battery system, which may cause local fire; and the third stage is propagation of thermal runaway of the battery system, which may be accompanied by propagation of fire. For the above three stages, the safety prevention and control system equipped by the vehicle power battery pack may have corresponding prevention and control measures.

In conventional battery monitoring and management systems and monitoring methods of electric vehicles, battery thermal runaway is determined by voltage, temperature, smoke concentration and gas concentration collected in real time. The monitoring systems and methods can only be used for alarming when thermal runaway occurs, and no active and direct prevention and control solution is proposed for the battery thermal runaway problem, and no early warning solution is proposed for a fault induced by early thermal runaway. Besides, the monitoring systems and methods cannot effectively suppress the propagation of thermal runaway within the battery pack after the thermal runaway of a battery cell, and the actual safety prevention and control effect is limited. As can be seen from the above, the conventional solutions are mostly passive prevention and control measures for the second and third stages of the safety accidents of electric vehicles. The conventional technical solutions cannot actively and directly monitor battery system faults of electric vehicles, and cannot comprehensively improve the safety of battery packs of electric vehicles.

In a safety prevention and control system of a power battery pack for an electric vehicle, safety accidents are characterized by multiple stages. The first stage is a fault of a battery system, which forms an inducement for thermal runaway of a battery cell. The second stage is thermal runaway of a battery cell in the battery system, which may cause local fire. The third stage is propagation of thermal runaway of the battery system, which may be accompanied by propagation of fire.

For the first stage, a timely early warning may be given when a fault occurs. Especially in the case that relevant test standards cannot cover all, there must be a real-time early warning mechanism for long-term monitoring of life cycle safety, such as fault diagnosis for self-initiated internal short-circuit, and a real-time diagnosis and early warning mechanism of battery cell leakage.

For the second stage, in addition to a timely warning when thermal runaway occurs, the prevention and control system may also initiate a thermal runaway suppression measure to delay or even prevent the occurrence of thermal runaway propagation. If a fire occurs during the thermal runaway of a cell, the prevention and control system may promptly extinguish the fire that occurs, so as to prevent the flame from burning and causing further damage to a battery component.

For the third stage, when thermal runaway propagation occurs, the prevention and control system may have the ability to prevent and control a secondary accident, and do its best to delay and prevent an explosion that may cause great harm to people. In case of a possible secondary fire, the prevention and control system may have the ability to extinguish the secondary fire.

Among the safety accidents of electric vehicles, fire and explosion of the battery pack are the most worrying phenomena. It is necessary to have a clear understanding of the possible fire and explosion phenomena of the battery pack and formulate reasonable prevention and control functions. Generally, a prevention and control systems is designed based on three elements of fire, that is, high temperature, combustibles and oxygen. For high temperature, when a battery pack has a safety accident, it is mainly caused by local high temperature due to thermal runaway. Therefore, in order to prevent and control a battery pack fire, it is important to weaken high temperature caused by thermal runaway. If a timely warning can be made in the fault stage (first stage) before thermal runaway occurs, thermal runaway will not occur, that is, a fire is fundamentally prevented. Of course, it is also effective to increase the amount of cooling through a cooling system after the occurrence of thermal runaway, or cool by spraying a fire extinguishing agent through a fire extinguishing device after a fire. For combustibles, it is currently believed that if a battery pack has a safety accident, the most flammable combustible in the battery pack is an organic electrolyte inside a lithium ion power battery. If the organic electrolyte leaks and spreads in the battery pack, it may cause the fire to spread or even cause explosion. In case the organic electrolyte leaks, it is a feasible prevention and control measure to pump out a combustible gas in time to make all areas inside the battery system not reach the limit of fire or explosion. For oxygen, the oxygen concentration may be diluted by spraying a fire extinguishing agent through a fire extinguishing device, and the influence of the oxygen may be removed by filling the battery pack with an inert gas. However, when thermal runaway occurs in a lithium ion power battery, a certain amount of active oxygen may be generated inside the lithium ion power battery, and the way of filling an inert gas to suppress the fire of the battery pack may have a limited effect.

It is noted that, although fire and explosion-proof control is an important part of battery pack safety prevention and control, when battery safety prevention and control is performed, only fire and explosion-proof control cannot guarantee the safety of the battery pack to the greatest extent. This is because battery thermal runaway is a common and key problem of battery pack safety, but thermal runaway is not the sufficient condition for fire and explosion. Battery pack safety prevention and control may take thermal runaway prevention and control as the core to prevent and control, step by step, the accident phenomena such as fault inducement, cell thermal runaway, thermal runaway propagation, and fire and explosion, which occur in sequence. In addition, gas released in the case of battery pack thermal runaway may cause the risk of suffocation to an occupant, and this must also be cared in the process of step-by-step safety prevention and control.

SUMMARY

The following presents a simplified summary of the invention in order to provide a basic understanding of some aspects of the invention. This summary is not an extensive overview of the invention. It is not intended to identify critical elements or to delineate the scope of the invention. Its sole purpose is to present some concepts of the invention in a simplified form as a prelude to the more detailed description that is presented elsewhere.

In some embodiments, the disclose provides a safety prevention and control system of a power battery pack for an electric vehicle. The system includes a battery pack for powering the electric vehicle. The safety prevention and control system further includes a signal acquisition device, a main controller, and a step-by-step prevention and control execution device. One end of the signal acquisition device is electrically connected to the battery pack, and the other end of the signal acquisition device is electrically connected to the main controller, for acquiring monitoring information of the battery pack, and transmitting the monitoring information to the main controller. The main controller includes a fault diagnosis device, a cell thermal runaway determination device and a battery pack thermal runaway propagation determination device. The fault diagnosis device, the cell thermal runaway determination device, and the battery pack thermal runaway propagation determination device are respectively electrically connected to the step-by-step prevention and control execution device, for sending a control instruction to the step-by-step prevention and control execution device. The step-by-step prevention and control execution device executes a prevention and control action according to the control instruction sent by the fault diagnosis device, the cell thermal runaway determination device, and the battery pack thermal runaway propagation determination device.

In other embodiments, the disclosure provides a control method for a safety prevention and control system of a power battery pack for an electric vehicle. The safety prevention and control system of the power battery pack includes a battery pack for powering the electric vehicle, a signal acquisition device with one end being electrically connected to the battery pack, a main controller electrically connected to the other end of the signal acquisition device, and a step-by-step prevention and control execution device electrically connected to the main controller. The control method includes the following steps. S100, acquiring, by the signal acquisition device, monitoring information of the battery pack, and transmitting the monitoring information to the main controller. S200, generating, by the main controller, a control instruction according to the monitoring information, and sending the control instruction to the step-by-step prevention and control execution device. S300, executing, by the step-by-step prevention and control execution device, a prevention and control action according to the control instruction sent by the main controller.

In further embodiments, the disclosure provides a safety prevention and control system of a power battery pack for an electric vehicle. The system includes a battery pack, a signal acquisition device, a main controller, and a step-by-step prevention and control execution device. The battery pack powers the electric vehicle. One end of the signal acquisition device is electrically connected to the battery pack, and the other end of the signal acquisition device is electrically connected to the main controller, for acquiring monitoring information of the battery pack, and transmitting the monitoring information to the main controller. The main controller includes a fault diagnosis device, a cell thermal runaway determination device and a battery pack thermal runaway propagation determination device. The fault diagnosis device, the cell thermal runaway determination device, and the battery pack thermal runaway propagation determination device are respectively electrically connected to the step-by-step prevention and control execution device, for sending a control instruction to the step-by-step prevention and control execution device. The step-by-step prevention and control execution device executes a prevention and control action according to the control instruction sent by the fault diagnosis device, the cell thermal runaway determination device, and the battery pack thermal runaway propagation determination device. The fault diagnosis device includes an internal short-circuit detector, an external short-circuit detector, a charge and discharge fault detector, an insulation failure detector, a collision detector, a liquid leakage and fire detector and a superheat detector. The internal short-circuit detector, the external short-circuit detector, the charge and discharge fault detector, the insulation failure detector, the collision detector, the liquid leakage and fire detector, and the superheat detector are respectively electrically connected to the signal acquisition device. The internal short-circuit detector, the external short-circuit detector, the charge and discharge fault detector, the insulation failure detector, the collision detector, the liquid leakage and fire detector, and the superheat detector respectively and concurrently diagnose different types of faults, determine the fault type, and send a control instruction with a fault level 1 targeting different fault types to the step-by-step prevention and control execution device. The battery pack thermal runaway propagation determination device further includes a battery pack thermal runaway propagation fire determination device, a battery pack thermal runaway propagation explosion determination device, and a timer. The battery pack thermal runaway propagation fire determination device, the battery pack thermal runaway propagation explosion determination device, and the timer are respectively electrically connected to the signal acquisition device. The battery pack thermal runaway propagation fire determination device determines whether a thermal runaway propagation fire occurs in the battery pack. The battery pack thermal runaway propagation explosion determination device determines whether a thermal runaway propagation explosion occurs in the battery pack, and if an explosion occurs, send a control instruction with a fault level 4 to the step-by-step prevention and control execution device. The timer is electrically connected to the battery pack thermal runaway propagation explosion determination device for recording a time interval from thermal runaway of a battery cell to the explosion of the battery pack. The step-by-step prevention and control execution device includes an alarm device, a thermal runaway inducement suppression device, a thermal runaway zone suppression device, a fire extinguishing device, and a safety relief device that are respectively electrically connected to the main controller. The thermal runaway inducement suppression device includes a disconnecting device and an isolating device. The disconnecting device and the isolating device are respectively disposed on a device that is to execute a corresponding prevention and control action. The disconnecting device disconnects a fault cell and a fault zone circuit. The isolating device isolates the fault cell, isolate a charge and discharge circuit, and disconnect a main circuit of the battery pack.

BRIEF DESCRIPTION OF THE DRAWINGS

Illustrative embodiments of the disclosure are described in detail below with reference to the attached drawing figures.

DETAILED DESCRIPTION

Figure 1:
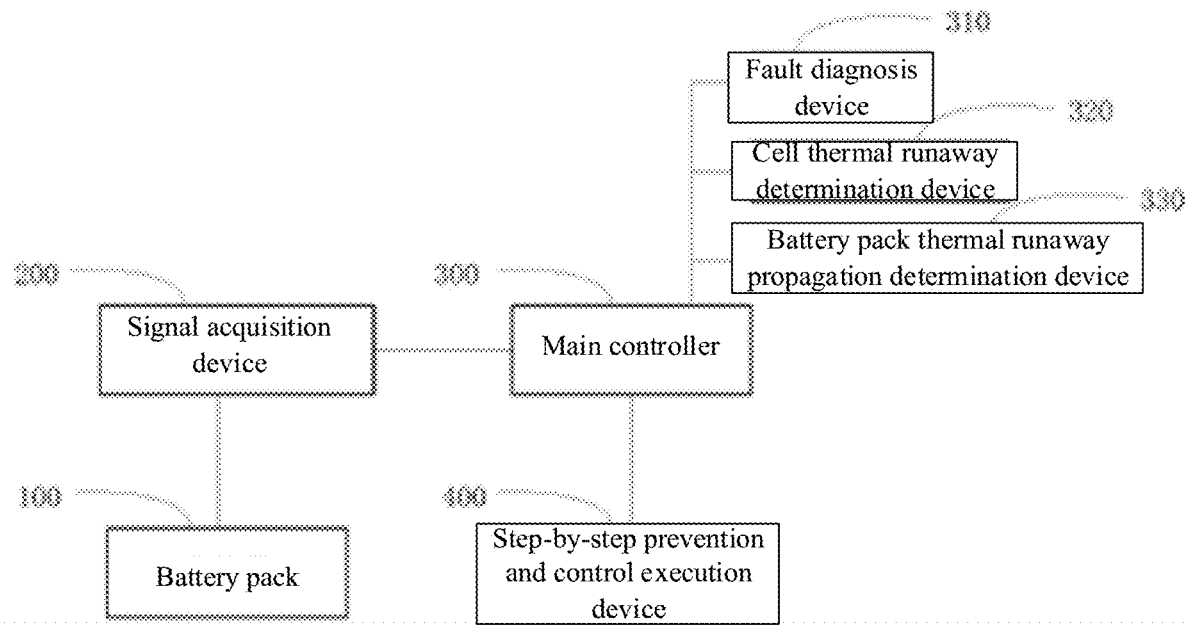
FIG. 1 shows a schematic structural diagram of a safety prevention and control system of a power battery pack for an electric vehicle in an embodiment.
Figure 2:
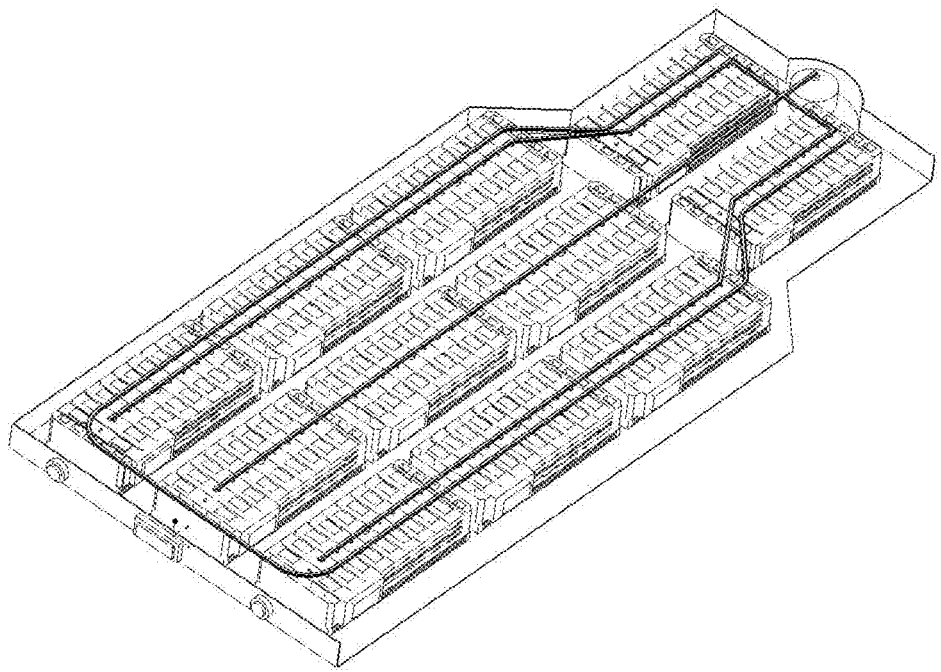
FIG. 2 shows a schematic diagram of a partial structure of a safety prevention and control system of a power battery pack for an electric vehicle in an embodiment.
Figure 3:
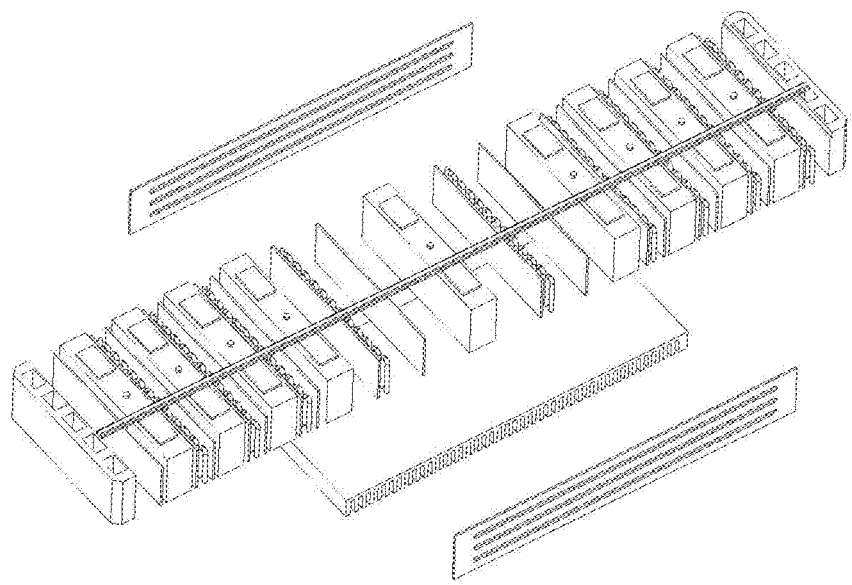
FIG. 3 shows a schematic diagram of a partial structure of a safety prevention and control system of a power battery pack for an electric vehicle in an embodiment.

The following describes some non-limiting exemplary embodiments of the invention with references to the accompanying drawings. The described embodiments are merely a part rather than all of the embodiments of the invention. All other embodiments obtained by a person of ordinary skill in the art based on the embodiments of the disclosure shall fall within the scope of the disclosure.

The embodiments of the disclosure are described below with reference to the accompanying drawings in the embodiments of the disclosure. In these drawings, 100 represents battery pack, 101 represents battery cell, 102 represents battery box, 103 represents battery module end plate, 104 represents battery module side plate, 110 represents zone I, 111 represents zone I first battery module, 112 represents zone I second battery module, 11N represents zone I Nth battery module, 120 represents zone II, 121 represents zone II first battery module, 122 represents zone II second battery module, 12N represents zone II Nth battery module, 130 represents zone III, 140 represents zone IV, 150 represents zone V, 160 represents zone VI, 170 represents zone VII, 180 represents zone VIII, 190 represents zone IX, 1A0 represents zone XI, 1B0 represents zone XII, 1N0 represents zone N, 1N1 represents zone N first battery module, 1N2 represents zone N second battery module, 1NN represents zone N Nth battery module, 200 represents signal acquisition device, 210 represents signal sensor, 211 represents voltage sensor, 212 represents temperature sensor, 213 represents current sensor, 214 represents insulation detection sensor, 215 represents collision signal sensor, 216 represents combustible gas sensor, 217 represents flame detection sensor, 218 represents explosion detection sensor, 220 represents signal acquisition circuit board, 221 represents first acquisition sub-board, 222 represents second acquisition sub-board, 223 represents third acquisition sub-board, 224 represents fourth acquisition sub-board, 225 represents fifth acquisition sub-board, 226 represents sixth acquisition sub-board, 227 represents seventh acquisition sub-board, 228 represents eighth acquisition sub-board, 229 represents ninth acquisition sub-board, 230 represents signal transmission harness, 300 represents main controller, 301 represents processor, 302 represents selector, 303 represents electrochemical state determining device, 304 represents heat generation state determining device, 305 represents logic operator, 310 represents fault diagnosis device, 311 represents internal short-circuit detector, 312 represents external short-circuit detector, 313 represents charge and discharge fault detector, 314 represents insulation failure detector, 315 represents collision detector, 316 represents liquid leakage and fire detector, 317 represents superheat detector, 31X represents other detectors, 320 represents battery cell thermal runaway determination device, 321 represents battery cell thermal runaway predictor, 322 represents battery cell thermal runaway locator, 330 represents battery pack thermal runaway propagation determination device, 331 represents battery pack thermal runaway propagation predictor, 332 battery pack thermal runaway propagation locator, 333 represents battery pack thermal runaway propagation fire determination device, 334 represents battery pack thermal runaway propagation explosion determination device, 335 represents timer, 340 represents signal receiver, 350 control signal transmitter, 360 represents functional safety guarantee device, 400 represents step-by-step prevention and control execution device, 410 alarm device, 420 represents thermal runaway inducement suppression device, 421 represents disconnecting device, 422 represents isolating device, 430 represents thermal runaway zone suppression device, 431 represents heat flow passive guiding device, 432 represents heat insulation layer, 433 represents oriented heat conduction plate 434 represents phase change heat storage layer, 435 represents heat flow active guiding device, 436 represents cooling line, 437 represents liquid cooling pump, 438 represents heat exchanger, 439 represents combustible gas pumping device, 440 represents fire extinguishing device, 441 represents fire extinguishing agent tank body, 442 represents fire extinguishing agent conveying line, 443 represents fire extinguishing agent spray valve body, 444 represents zone I fire extinguishing agent spray valve body, 445 represents zone II fire extinguishing agent spray valve body, and 450 represents safety relieve device. P10 represents fault types, P11 represents internal short-circuit fault, P12 represents external short-circuit fault, P13 represents charge and discharge fault, P14 represents insulation failure fault, P15 represents collision fault, P16 represents liquid leakage or fire fault, P17 represents superheat fault, P18 represents other faults, P131 represents overcharge fault, P132 represents over-discharge fault, P181 represents external virtual connection fault, P182 represents sensor fault, and P183 represents communication fault. S11 represents an option to disconnect a fault battery cell circuit, disconnect a fault zone circuit, and isolate a fault battery cell, S12 represents an option to protect charge and discharge, S13 represents an option to disconnect a main circuit of a battery pack, S14 represents an option to reduce the concentration of a combustible gas, S15 represents an option to extinguish a fire, S16 represents an option to enhance heat dissipation in a corresponding zone, and S17 represents corresponding fault solutions. A1 represents main controller algorithm, A11 represents fault diagnosis, A12 represents cell thermal runaway determination, A13 represents battery pack thermal runaway propagation determination, A111 represents parallel fault diagnosis, A112 represents fault type determination, A113 represents cell thermal runaway, A114 represents cell thermal runaway fire, A115 represents battery pack thermal runaway propagation, A116 represents thermal runaway propagation fire, and A117 represents thermal runaway propagation explosion. B1 represents an alarm level of danger. C1 represents a step-by-step prevention and control action. C11 represents an alarm, C12 represents a specific countermeasure, C13 represents a cell thermal runaway zone determination, C14 represents an option to activate thermal runaway propagation zone suppression mechanism, C15 represents an option to activate zone fire extinguishing mechanism, C16 represents an option to activate thermal runaway propagation secondary suppression mechanism, C17 represents an option to activate zone secondary fire extinguishing mechanism, C18 represents an option to ensure explosion time is greater than duration of thermal runaway, $D_{TR}$, and C19 represents a thermal runaway propagation zone determination. S10 represents a chart of symbolic meaning in FIG. 15. S101 symbol corresponds to logic order, S102 symbol corresponds to not satisfied, S103 symbol corresponds to satisfied, S104 symbol corresponds to any situation, and S105 symbol corresponds to activated if satisfied.

Referring to FIG. 1, a safety prevention and control system 10 of a power battery pack for an electric vehicle is provided. The system 10 may include a battery pack 100, a signal acquisition device 200, a main controller 300, and a step-by-step prevention and control execution device 400. As shown in FIG. 1, one end of the signal acquisition device 200 is electrically connected to the battery pack 100, and the other end of the signal acquisition device is electrically connected to the main controller 300. The signal acquisition device 200 may acquire monitoring information of the battery pack 100, and transmit the monitoring information to the main controller 300. The main controller 300 is electrically connected to the step-by-step prevention and control execution device 400, for transmitting a control signal to the step-by-step prevention and control execution device 400.

The main controller 300 of the safety prevention and control system 10 of a power battery pack for an electric vehicle may send different control instructions to control the step-by-step prevention and control execution device 400 to execute prevention and control actions of different levels. The safety prevention and control system 10 of a power battery pack for an electric vehicle may accurately start a prevention and control mechanism, maximize a safety protection effect, and ensure the safety of an electric vehicle occupant, according to the actual situation of a specific accident and the prevention and control ability of the prevention and control system. The safety prevention and control system 10 of a power battery pack for an electric vehicle may also make an active prevention and control measure and a passive prevention and control measure complement each other and promote each other. The active prevention and control measure refers to real-time monitoring and timely warning of characteristics of battery system accidents based on the above-mentioned three stages of battery safety accidents of electric vehicles. The passive prevention and control measure refers to adding corresponding components and mechanisms in the design process according to the characteristics of battery system accidents based on the three stages of battery safety accidents of electric vehicles, so as to delay or prevent the occurrence or propagation of accidents. The safety prevention and control system 10 of a power battery pack for an electric vehicle, by means of a fault diagnosis device 310, a battery cell thermal runaway determination device 320, and a battery pack thermal runaway propagation determination device 330 in the main controller 300, may make the active prevention and control measure and the passive prevention and control measure complement each other and promote each other. The safety prevention and control system 10 of a power battery pack for an electric vehicle may achieve step-by-step prevention and control of the safety problems of the battery pack, such as thermal runaway induced faults, cell thermal runaway, battery pack thermal runaway propagation, battery pack fire and explosion, and the release of combustible and harmful gases, according to the multi-stage characteristics of the safety accidents of the battery pack for electric vehicles.

Referring to FIG. 2 to FIG. 5, a diagram of a specific structure of the battery pack 100 is provided. The battery pack 100 may power the electric vehicle. A basic constituent unit of the battery pack 100 is a battery cell 101. One or more battery cells may constitute a battery module, and different battery modules may constitute a battery zone. The battery pack 100 may include a plurality of different zones, for example, a battery pack that provides power and a battery pack that provides a signal are disposed in different zones. The battery pack 100 may be provided with a battery box 102. The battery box 102 may include a zone I 110, a zone II 120, a zone III 130, a zone IV 140, a zone V 150, a zone VI 160, a zone VII 170, a zone VIII 180, a zone IX 190, a zone X 1A0, and a zone XI 1B0. Each zone may include different battery modules. The zone I 110 may include different battery modules, for example: a zone I first battery module 111, a zone I second battery module 112, a zone I third battery module 113, a zone I fourth battery module 114, a zone I fifth battery module 115 . . . , and a zone I Nth battery module 11N. The zone II 120 may further include a zone II first battery module 121, a zone II second battery module 122 . . . , and a zone II Nth battery module 12N. The zones of the battery pack 100 may be set and properly divided according to different needs. The number of modules in a specific zone may be set as needed. To make the battery pack 100 effectively protected, the battery pack 100 is divided into zones according to the location of the battery cell 101, and each zone may include one or more sub-modules.

Figure 4:
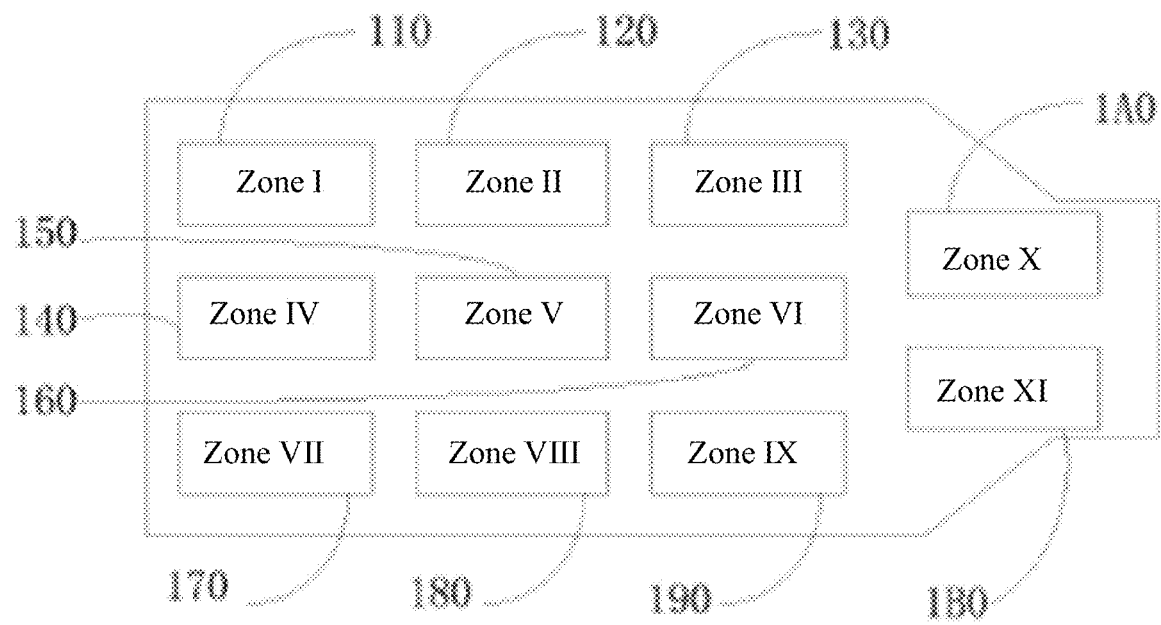
FIG. 4 shows a schematic diagram of zoning of a battery pack in an embodiment.
Figure 5:
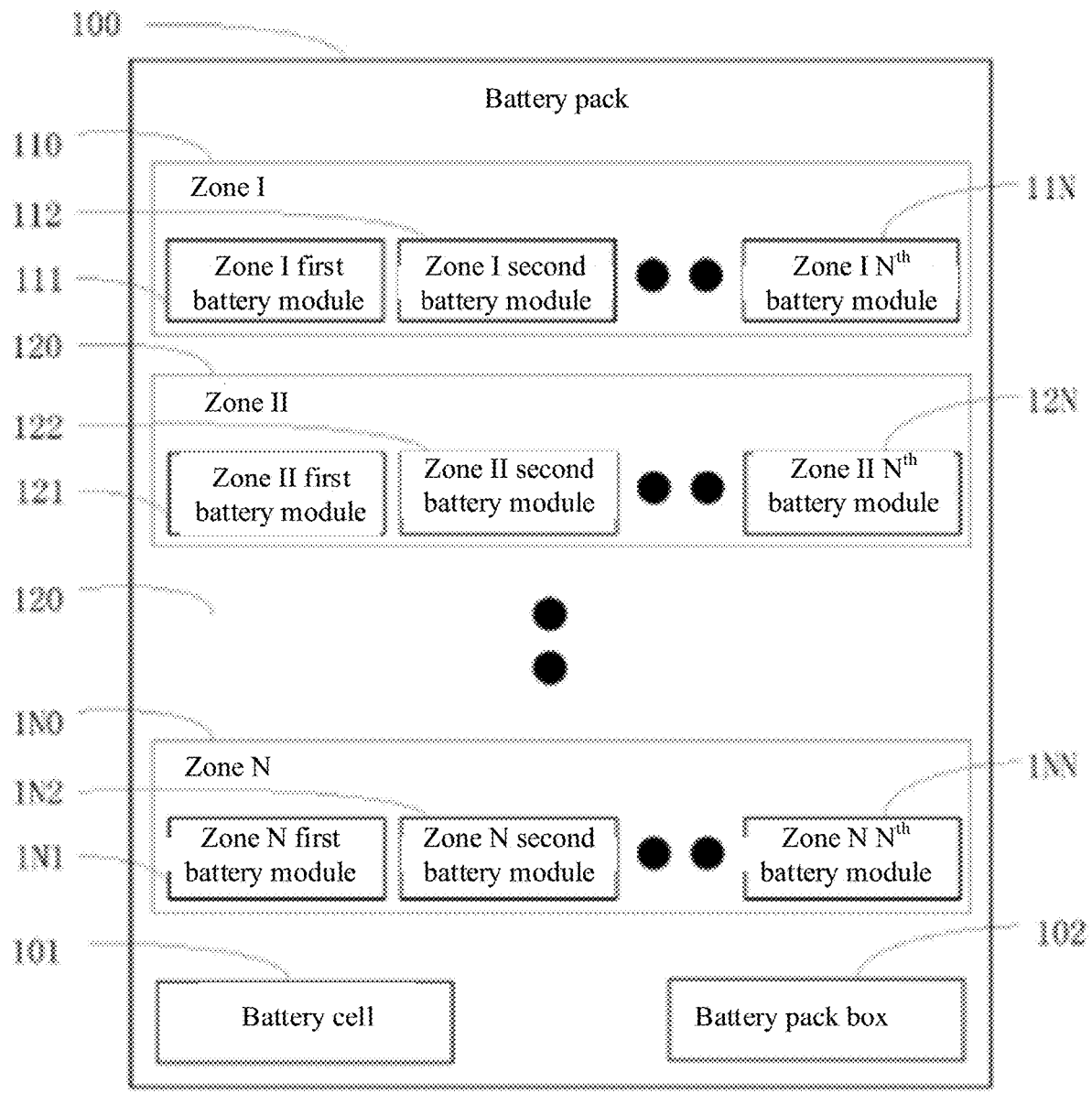
FIG. 5 shows a schematic structural diagram of a battery pack of a safety prevention and control system of a power battery pack for an electric vehicle in an embodiment.

In an embodiment, the battery pack 100 is divided into 11 zones, and the 11 zones are numbered 110 to 1B0, respectively, as shown in FIG. 4. A and B represent 10 and 11 in hexadecimal. The battery pack 100 may include a battery box 102. The battery cell 101 may be cylindrical, square, or may be set according to the need of use. Each battery module of each zone may be connected in series, in parallel or in series and in parallel. The zone design may be adjusted in accordance to a vehicle space, the carrying amount of a fire extinguishing agent is limited, or the cooling capacity of a thermal runaway suppression system is limited. In case of thermal runaway or fire, thermal runaway suppression and fire extinguishing actions may be performed at fixed points in different zones.

Figure 6:
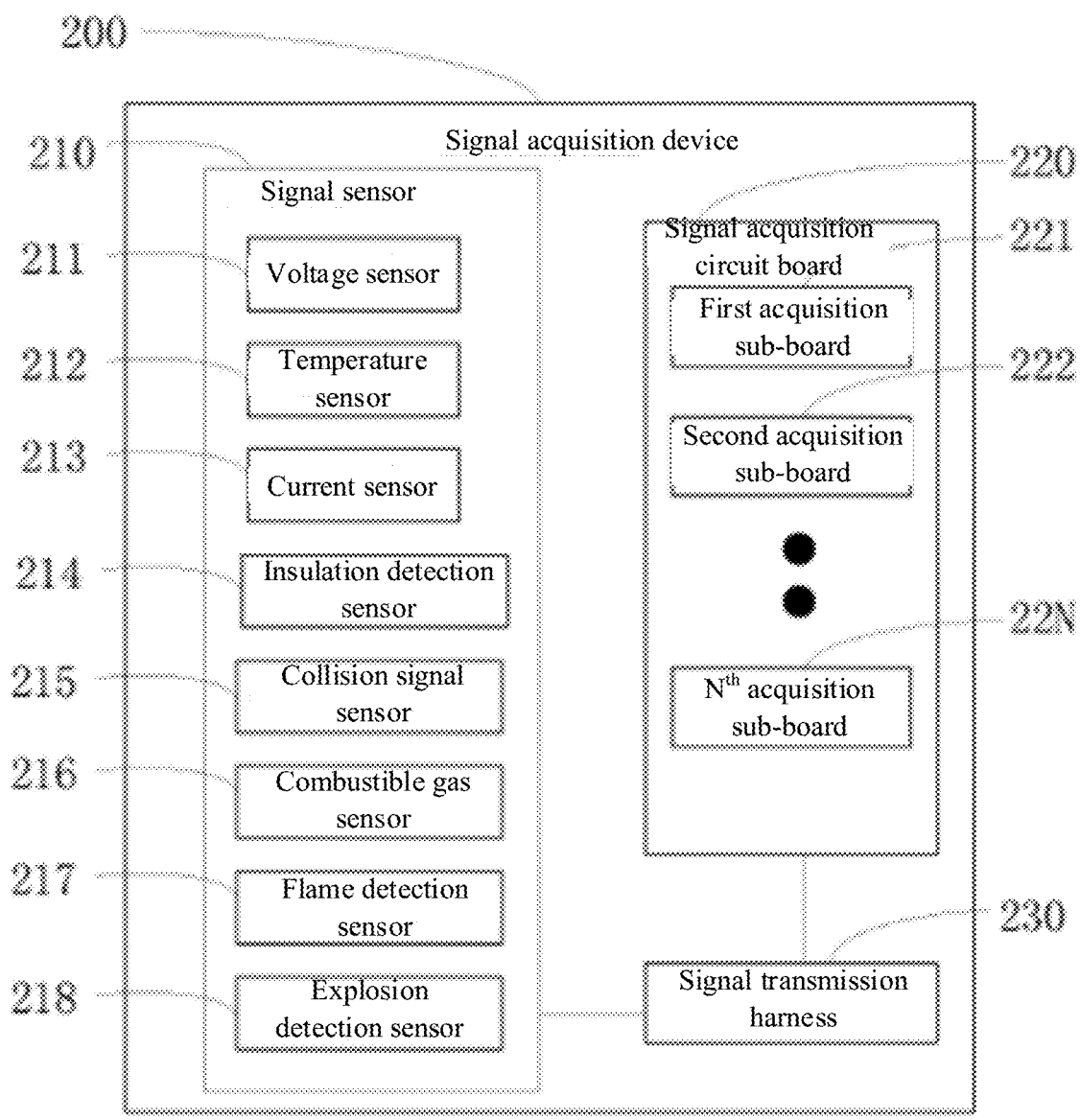
FIG. 6 shows a schematic structural diagram of a signal acquisition device in an embodiment.

Referring to FIG. 6, the signal acquisition device 200 is provided. The signal acquisition device 200 may detect a battery cell signal for the diagnosis of a fault induced by early thermal runaway. In an embodiment, the signal acquisition device 200 may include a signal sensor 210, a signal acquisition circuit board 220, a signal transmission harness 230, and the like. The signal sensor 210 is disposed at a position close to the battery pack 100, and may accurately acquire current temperature state, usage state information, and the like of the battery pack 100. The signal acquisition circuit board 220 is disposed in cooperation with the signal sensor 210. The signal acquisition circuit board 210 may be provided in plurality, and specifically, one acquisition circuit board may be disposed for each signal sensor 210. For example, the signal acquisition circuit board 220 may include a first acquisition sub-board 221, a second acquisition sub-board 222, an Nth acquisition sub-board, and the like. It may be understood that the signal acquisition harness 230 may achieve electrical connection and signal transmission. The signal acquisition harness 230 may transmit a signal collected by the signal sensor 210 to the controller 300.

The signal sensor 210 may be one or more of a voltage sensor 211, a temperature sensor 212, a current sensor 213, an insulation detection sensor 214, a collision signal sensor 215, a combustible gas sensor 216, a flame detection sensor 217, and an explosion detection sensor 218. The signal sensor 210 may be disposed at different locations of the battery pack 100 as needed. Each zone of the battery pack has an independent acquisition sub-board, and the sensors such as the voltage sensor 211, the temperature sensor 212, the insulation detection sensor 214, the combustible gas sensor 216 and the flame detection sensor 217 first transmit a signal to a signal acquisition sub-board of a corresponding zone, and then the signal acquisition sub-board sends the signal to the main controller 300. If signal sensors, such as the current sensor 213, the collision signal sensor 215 and the explosion detection sensor 218 are unique in the entire battery pack 100, a signal acquired by these signal sensors is directly sent to the main controller 300.

The specific form of the signal acquisition device 200 is not limited. As the technology advances, other devices capable of detecting the signals of the battery pack may also be mounted to corresponding locations of the battery pack 100. It may be understood that any device capable of obtaining battery state information is within the protection scope of the disclosure. In this embodiment, a plurality of detection sensors may be installed to acquire battery state information in an all-round manner, so that the battery state information acquired by the system is more accurate and reliable.

Figure 7:
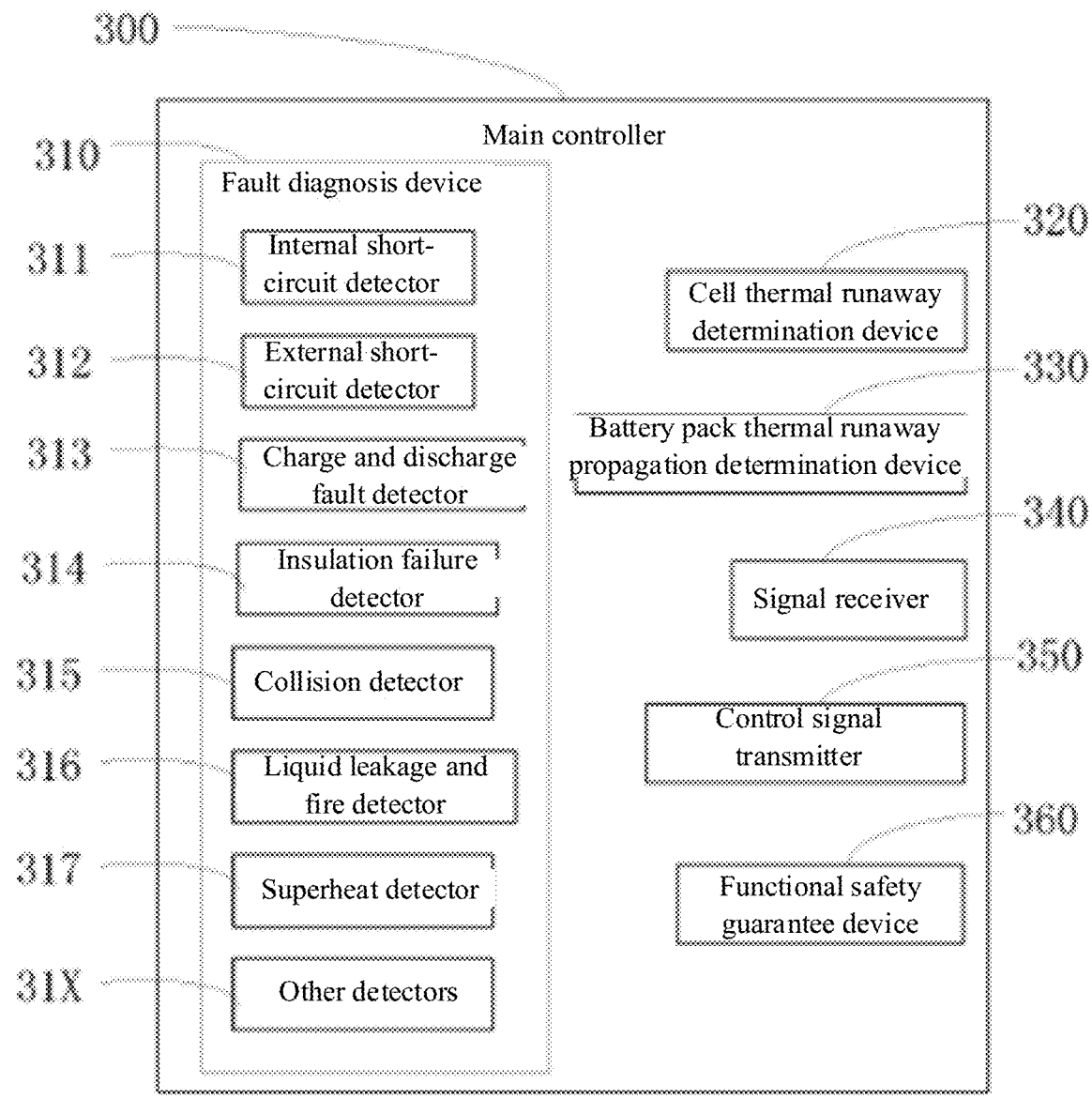
FIG. 7 shows a schematic diagram of a hardware structure of a main controller in an embodiment.

Referring to FIG. 7, a schematic structural diagram of the main controller 300 is provided. The main controller 300 may include a fault diagnosis device 310, a battery cell thermal runaway determination device 320, and a battery pack thermal runaway propagation determination device 330. The fault diagnosis device 310, the battery cell thermal runaway determination device 320, and the battery pack thermal runaway propagation determination device 330 are respectively electrically connected to the step-by-step prevention and control execution device 400, for sending different control instructions to the step-by-step prevention and control execution device 400.

The main controller 300 may perform model-based battery safety state monitoring according to a real-time signal of the battery pack 100 detected by the signal acquisition device 200. The main controller 300 may be provided with a main control chip capable of implementing a corresponding function, and the main controller 300 may further include a signal receiver 340, a control signal transmitter 350, a functional safety device 360, and the like. The main controller chip runs a control program for battery safety state monitoring. The fault diagnosis device 310, the battery cell thermal runaway determination device 320, and the battery pack thermal runaway propagation determination device 330 in the main controller 300 complete the real-time monitoring of the battery pack 100 by different stages and functions.

In an embodiment, the fault diagnosis device 310 may include an internal short-circuit detector 311, an external short-circuit detector 312, a charge and discharge fault detector 313, an insulation failure detector 314, a collision detector 315, a liquid leakage and fire detector 316, a superheat detector 317, and other detectors 31X, which are respectively electrically connected to the signal acquisition device 200. The different types of fault diagnosis devices 310 above may respectively and concurrently diagnose different types of faults, determine the fault type, and send a control instruction with a fault level 1 targeting different fault types to the step-by-step prevention and control execution device 400.

Figure 8:
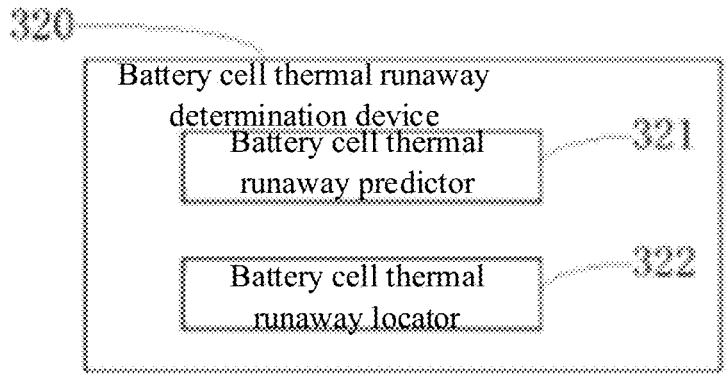
FIG. 8 shows a schematic structural diagram of a battery cell thermal runaway determination device in an embodiment.

Referring to FIG. 8, in an embodiment, the battery cell thermal runaway determination device 320 may include a battery cell thermal runaway predictor 321 and a battery cell thermal runaway locator 322. The battery cell thermal runaway predictor 321 and the battery cell thermal runaway locator 322 are respectively electrically connected to the signal acquisition device 200. The battery cell thermal runaway predictor 321 may predict the possibility of thermal runaway of a battery cell. The battery cell thermal runaway locator 322 may determine a zone where thermal runaway occurs in a battery cell. The battery cell thermal runaway locator 322 may send a control instruction with a fault level 2 to the step-by-step prevention and control execution device 400 based on a different size of the possibility of thermal runaway of a battery cell and a different zone where thermal runaway occurs in a battery cell.

Figure 9:
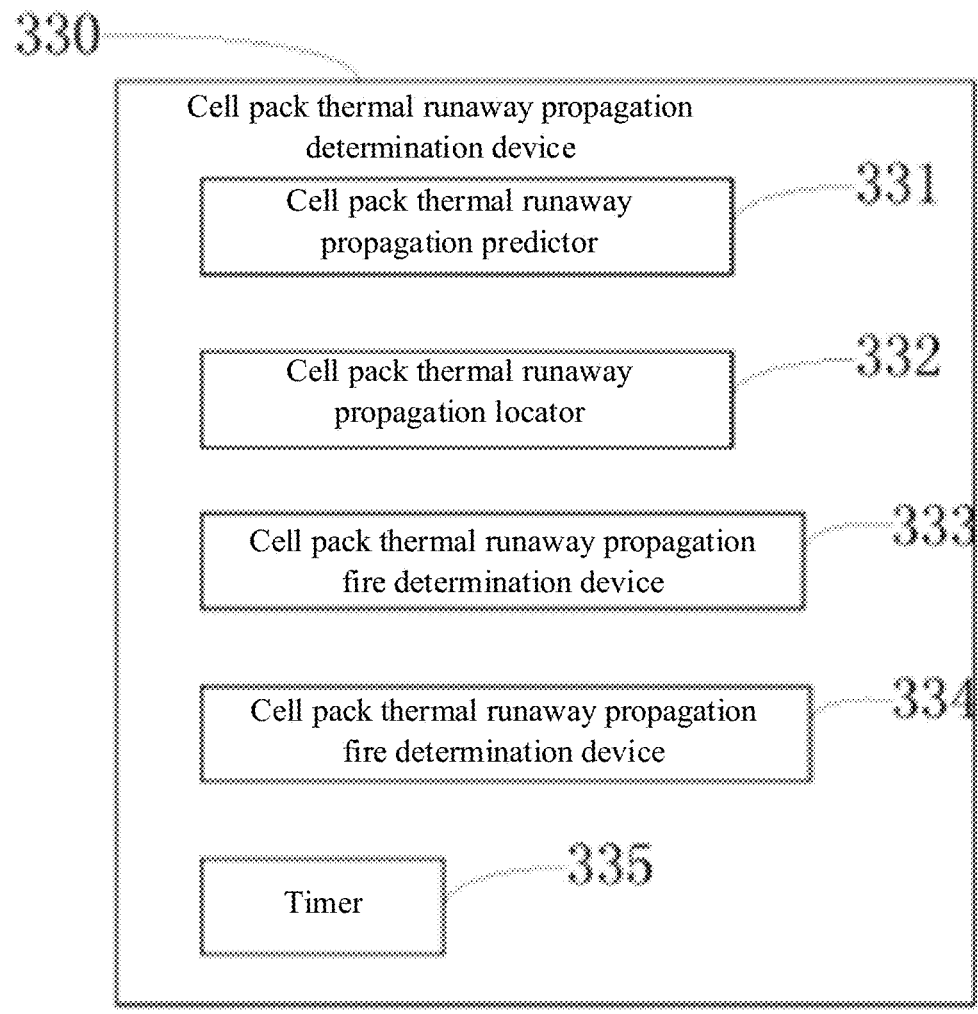
FIG. 9 shows a schematic structural diagram of a battery pack thermal runaway propagation determination device in an embodiment.

Referring to FIG. 9, in an embodiment, the battery pack thermal runaway propagation determination device 330 may include a battery pack thermal runaway propagation predictor 331 and a battery pack thermal runaway propagation locator 332. The battery pack thermal runaway propagation predictor 331 and the battery pack thermal runaway propagation locator 332 are respectively electrically connected to the signal acquisition device 200. The battery pack thermal runaway propagation predictor 331 may determine whether thermal runaway propagation occurs in the battery pack and an adjacent zone. The battery pack thermal runaway propagation locator 332 may locate a zone of the battery pack where thermal runaway propagation occurs. A control instruction with a fault level 3 is sent to the step-by-step prevention and control execution device 400 regarding different situations such as whether thermal runaway propagation occurs in the battery pack 100, a zone of the battery pack where the thermal runaway propagation occurs, whether a thermal runaway propagation fire occurs in the battery pack, and whether a fire occurs in a battery cell.

In an embodiment, the battery pack thermal runaway propagation determination device 330 may further include a battery pack thermal runaway propagation fire determination device 333, a battery pack thermal runaway propagation explosion determination device 334, and a timer 335. The battery pack thermal runaway propagation fire determination device 333, the battery pack thermal runaway propagation explosion determination device 334, and the timer 335 are respectively electrically connected to the signal acquisition device 200. The battery pack thermal runaway propagation fire determination device 333 may determine whether a thermal runaway propagation fire occurs in the battery pack. The battery pack thermal runaway propagation explosion determination device 334 may determine whether a thermal runaway propagation explosion occurs in the battery pack, and if an explosion occurs, send a control instruction with a fault level 4 to the step-by-step prevention and control execution device 400. The timer is 335 electrically connected to the battery pack thermal runaway propagation explosion determination device 334 for recording a time interval from thermal runaway of a battery cell to the explosion of the battery pack.

The arrangement of the battery pack thermal runaway propagation explosion determination device 334 and the timer 335 may enable the battery pack thermal runaway propagation determination device 330 to derive a determination result more accurately. A time interval from thermal runaway of a battery cell to the explosion of the battery pack (duration of thermal runaway, DTR) is recorded, and in the passive safety design of the battery system, it should be ensured that the time interval to the explosion (DTR) is greater than an escape time required by a person. In addition, it is also of great significance for determining and analyzing the accidents such as the thermal runaway explosion of the battery pack.

Figure 10:
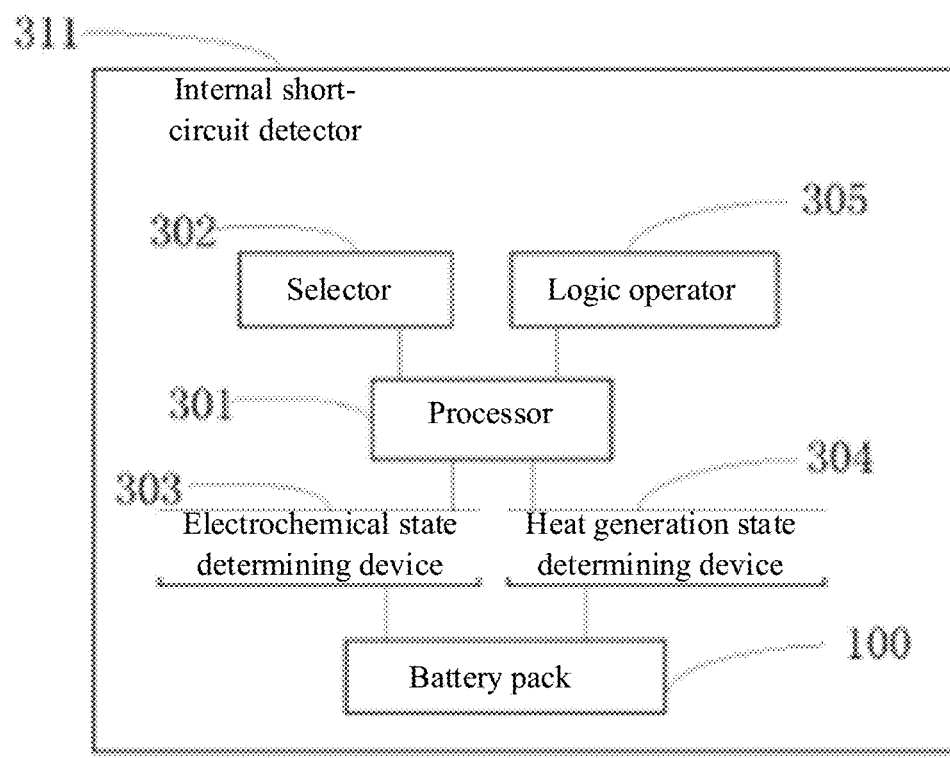
FIG. 10 shows a schematic structural diagram of an internal short-circuit detector in an embodiment.

Referring to FIG. 10, in an embodiment, the internal short-circuit detector 311 may include a processor 301, a selector 302, an electrochemical state determining device 303, a heat generation state determining device 304, and a logic operator 305.

One end of the electrochemical state determining device 303 and one end the heat generation state determining device 304 are respectively connected to the battery pack 100. The other end of the electrochemical state determining device 303 and the other end of the heat generation state determining device 304 are respectively connected to the processor 301. The electrochemical state determining device 303 may acquire the information of a battery having an extreme electrochemical state, perform model-based electrochemical abnormal state detection, and output a detection result of the electrochemical state of the battery. The heat generation state determining device 304 may acquire the information of a battery having an extreme heat generation state, perform model-based heat generation abnormal state detection, and output a detection result of the heat generation state of the battery. The processor 301 may store location and state information of the battery pack 100, and the processor 301 may further generate a control instruction for a prevention and control action. The selector 302 may screen an extreme battery based on an "average+difference" model. The logic operator 305 may perform a logic operation according to the detection results obtained by the electrochemical state determining device 303 and the heat generation state determining device 304, and output an operation result to the processor 301.

According to the extreme electrochemical state and the extreme heat generation state obtained by the electrochemical state determining device 303 and the heat generation state determining device 304, a logical "and" operation is performed. If the extreme electrochemical state and the extreme heat generation state both are 1, and battery cells corresponding to the extreme states are the same cell, it is determined that the battery cell has an internal short-circuit fault. The battery cell with the internal short-circuit fault is further estimated to estimate the degree of internal short-circuit, and the prevention and control execution device is required to perform corresponding prevention and control actions, such as alarming, disconnecting a circuit, and isolating the internal short-circuit battery.

Figure 11:
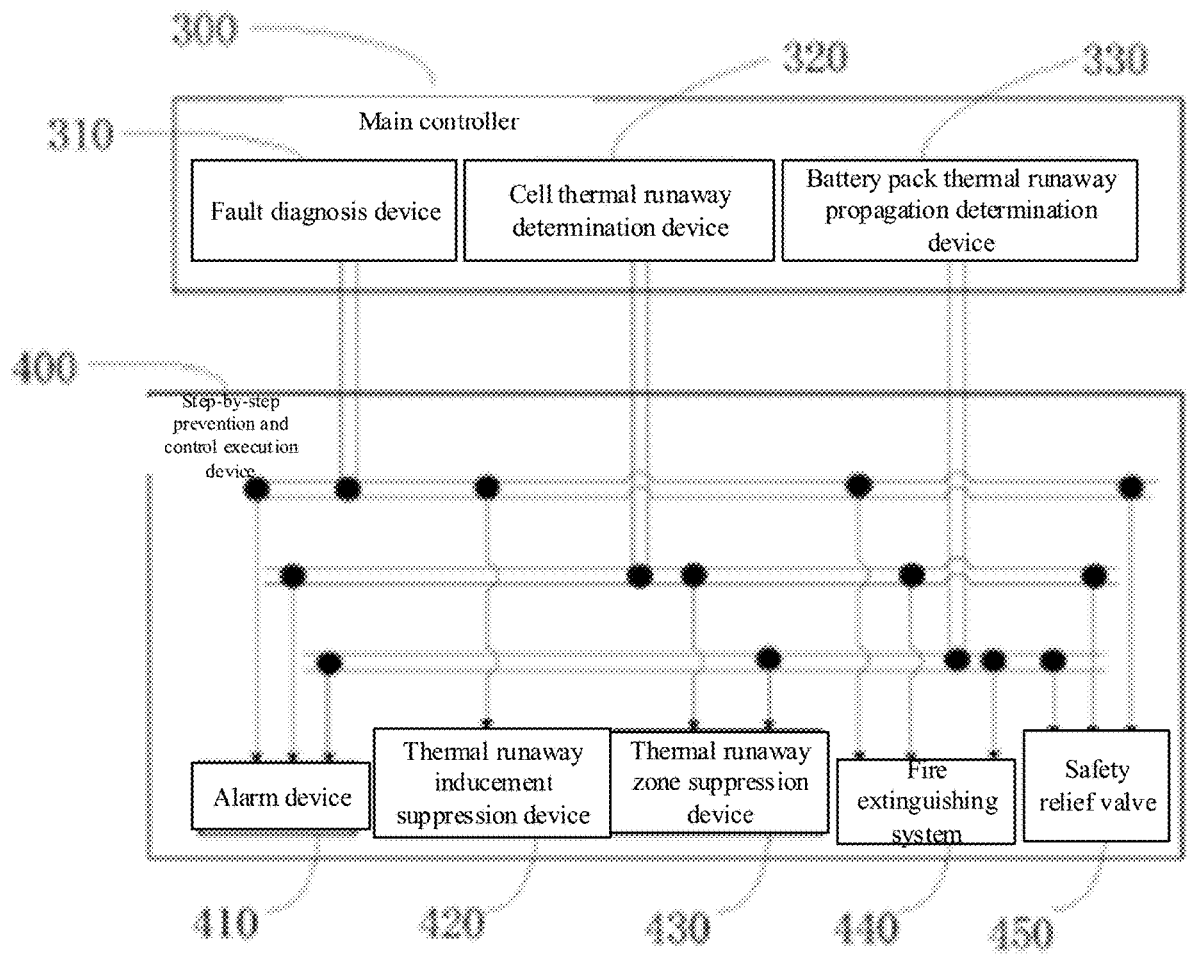
FIG. 11 shows a communication structure diagram of a main controller and a step-by-step prevention and control execution device in an embodiment.

Referring to FIG. 11, the step-by-step prevention and control execution device 400 may include an alarm device 410, a thermal runaway inducement suppression device 420, a thermal runaway zone suppression device 430, a fire extinguishing device 440, and a safety relief device 450. The alarm device 410, the thermal runaway inducement suppression device 420, the thermal runaway zone suppression device 430, the fire extinguishing device 440, and the safety relief device 450 are respectively electrically connected to the main controller 300.

The step-by-step prevention and control execution device 400 may execute prevention and control actions of different levels according to different control instructions sent by the fault diagnosis device 310, the battery cell thermal runaway determination device 320, and the battery pack thermal runaway propagation determination device 330. The step-by-step prevention and control execution device 400 receives the step-by-step safety prevention and control signals sent by the main controller 300 in real time, and performs corresponding safety prevention and control actions.

As can also be seen in FIG. 11, the main controller 300 and the step-by-step prevention and control execution device 400 are connected via a communication network. Corresponding control signals of the fault diagnosis device 310 control the alarm device 410, the thermal runaway inducement suppression device 420, the fire distinguishing device 440, and the safety relief device 450 to operate. Corresponding control signals of the cell thermal runaway determination device 320 control the alarm device 410, the thermal runaway zone suppression device 430, the fire extinguishing device 440, and the safety relief device 450 to operate. Corresponding control signals of the battery pack thermal runaway propagation determination device 330 control the alarm device 410, the thermal runaway zone suppression device 430, the fire extinguishing device 440, and the safety relief device 450 to operate.

Figure 12:
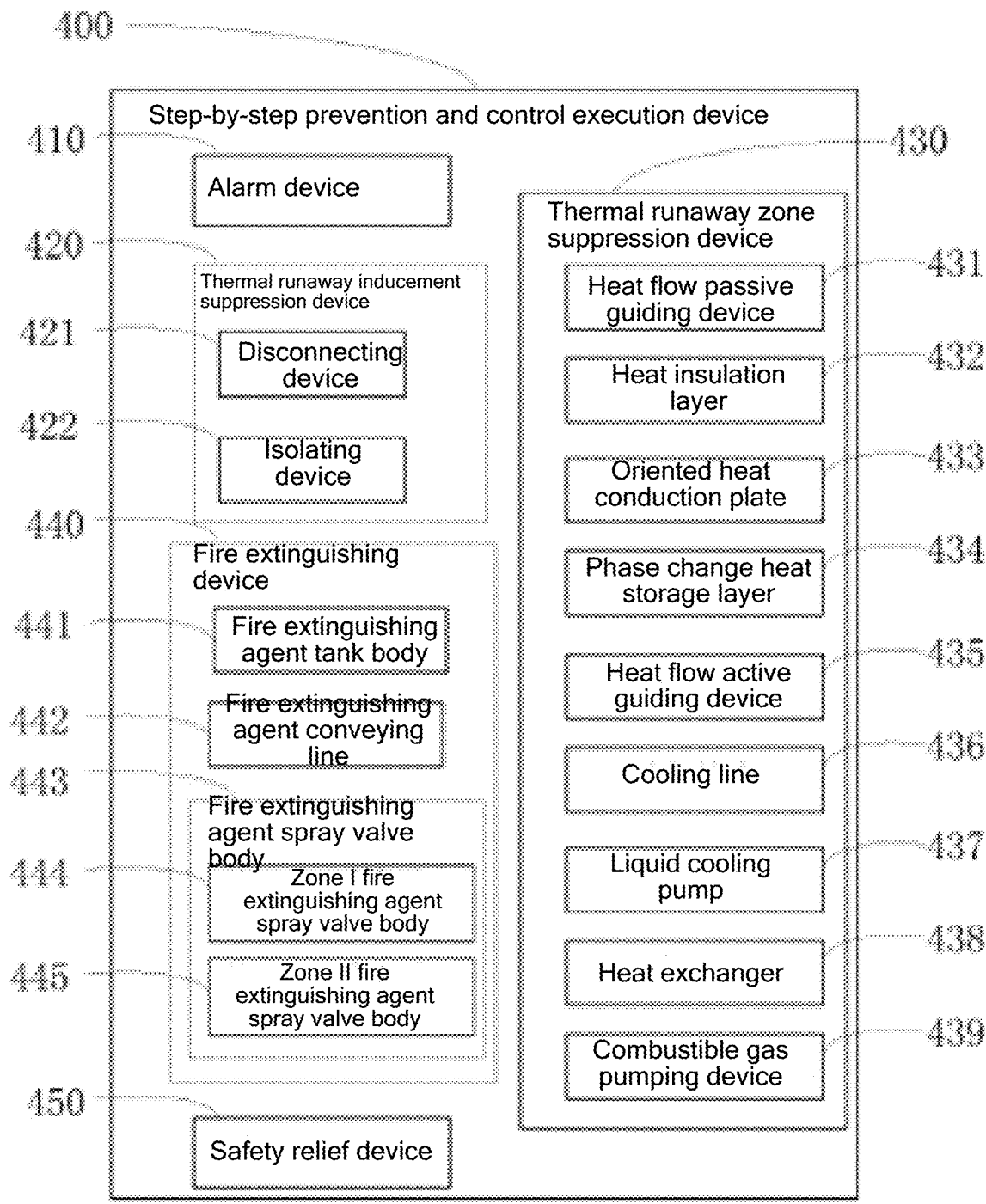
FIG. 12 shows a schematic structural diagram of a step-by-step prevention and control execution device in an embodiment.

Referring to FIG. 12, the thermal runaway inducement suppression device 420 may include a disconnecting device 421 and an isolating device 422. The disconnecting device 421 and the isolating device 422 are respectively disposed on a device that is to execute a corresponding prevention and control action. The disconnecting device 421 may disconnect a fault cell and a fault zone circuit. The isolating device 422 may isolate the fault cell, isolate a charge and discharge circuit, and disconnect a main circuit of the battery pack. The thermal runaway inducement suppression device 420 may achieve the functions of disconnecting a fault cell and a fault zone circuit and isolating the fault cell. The thermal runaway inducement suppression device 420 may achieve the functions such as protecting charge and discharge, disconnecting the main circuit of the battery pack, enhancing heat dissipation in a corresponding zone, reducing the concentration of a combustible gas, or extinguishing a fire that is not caused by thermal runaway.

The thermal runaway zone suppression device 430 may include a heat flow passive guiding device 431, a heat flow active guiding device 435, a heat exchanger 438, and a combustible gas pumping device 439. In the thermal runaway zone suppression device 430, the heat flow active guiding device 435 and the heat flow passive guiding device 431 achieve the suppression of thermal runaway propagation. The heat flow active guiding device 435, the heat exchanger 438 and the combustible gas pumping device 439 assist each other to achieve active guiding discharge of a heat flow. The heat flow passive guiding device 431, the heat exchanger 438 and the combustible gas pumping device 439 assist each other to achieve passive guiding discharge of the heat flow. The heat flow passive guiding device 431 is disposed in different zones of the battery pack 100 for passively guiding the heat flow when thermal runaway occurs. The heat flow active guiding device 435 is disposed in different zones of the battery pack 100 for actively guiding the heat flow when thermal runaway occurs. The heat exchanger 438 is disposed in different zones of the battery pack 100 for completing heat exchange between the battery pack 100 and the outside. The combustible gas pumping device 439 is disposed in different zones of the battery pack 100 for completing outward discharge of a combustible gas. The heat flow active guiding device 435 may include a cooling line 436 and a liquid cooling pump 437. The heat flow passive guiding device 431 may include a heat insulation layer 432, an oriented heat conduction plate 433, and a phase change heat storage layer 434.

In an embodiment, the fire extinguishing device 440 may include a fire extinguishing agent tank body 441, a fire extinguishing agent conveying line 442, and a fire extinguishing agent spray valve body 443. The fire extinguishing agent tank body 441 and the fire extinguishing agent spray valve body 443 are connected by the fire extinguishing agent conveying line 442. The fire extinguishing agent spray valve body 443 may include a zone I fire extinguishing agent spray valve body 444 and a zone II fire extinguishing agent spray valve body 445. The zone I fire extinguishing agent spray valve body 444 and the zone II fire extinguishing agent spray valve body 445 may complete a spraying of different doses of a fire extinguishing agent.

Figure 13:
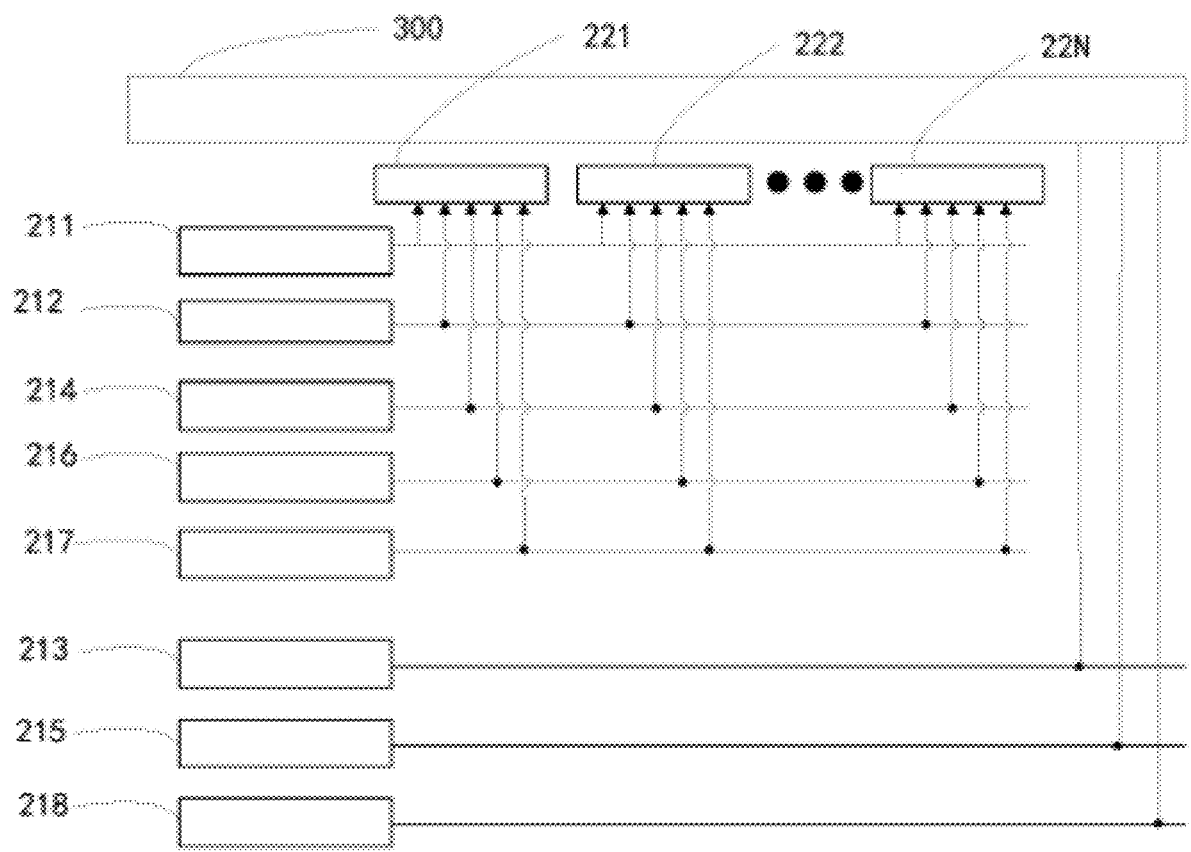
FIG. 13 shows a schematic diagram of signal connection between a signal acquisition device and a main controller in an embodiment.

Referring to FIG. 13, in an embodiment, the main controller 300 and the step-by-step prevention and control execution device 400 are in network communication. Specifically, the signal acquisition device 200 and the main controller 300 may be connected through a communication network. The communication network may include a controller area network (CAN), a FlexRay network, a recommended standard (RS) 232 network, a Bluetooth or a wireless fidelity (wifi) virtual signal transmission network, and the like. Specifically, the signal acquisition device 200 and main controller 300 are connected through a communication network. Each zone of the battery pack has an independent acquisition sub-board. The voltage sensor 211, the temperature sensor 212, the insulation detection sensor 214, the combustible gas sensor 216 and the flame detection sensor 217 first transmit a signal to an acquisition sub-board 220 of a corresponding zone, and then the acquisition sub-board 220 sends the signal to the main controller 300. If signal sensors, such as the current sensor 213, the collision signal sensor 215 and the explosion detection sensor 218 are unique in the entire battery pack 100, signals are directly sent to the main controller 300.

Figure 14:
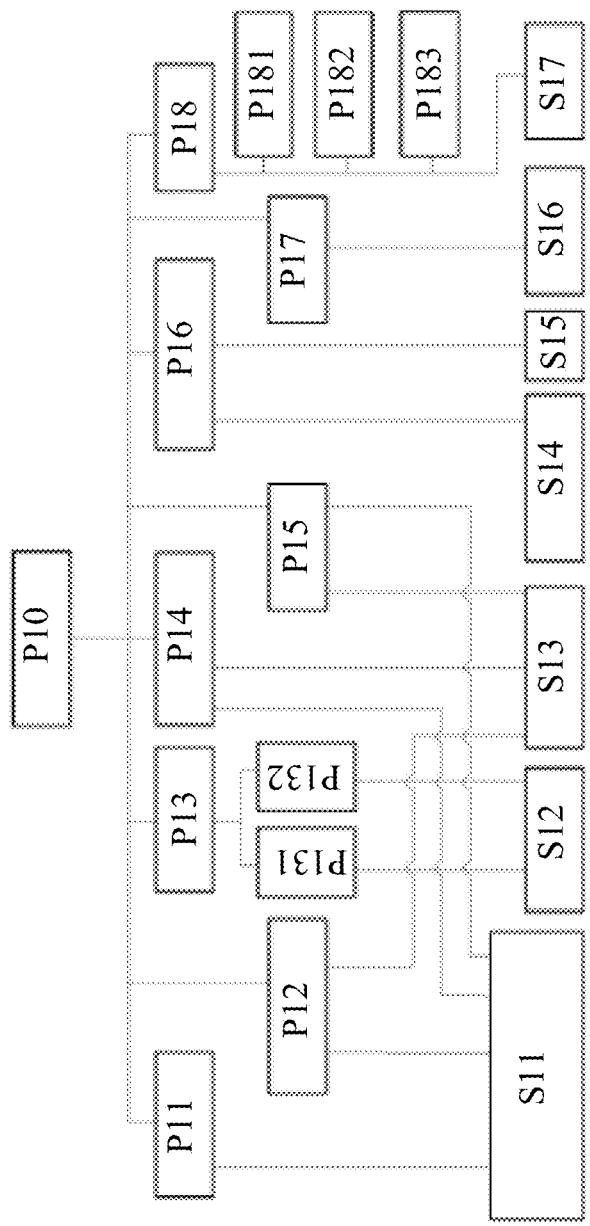
FIG. 14 shows a fault type and a corresponding solution of a safety prevention and control system of a power battery pack for an electric vehicle in an embodiment.

Referring to FIG. 14, in an embodiment, the fault diagnosis device 310 may determine whether the battery pack has a fault. The fault may include an internal short-circuit fault, an external short-circuit fault, a charge and discharge fault, an insulation failure fault, a collision fault, a liquid leakage or fire fault, a superheat fault, a virtual fault, a communication fault, and the like. The fault diagnosis device 310 may include an internal short-circuit detector 311, an external short-circuit detector 312, a charge and discharge fault detector 313, an insulation failure detector 314, a collision detector 315, a liquid leakage and fire detector 316, a superheat detector 317, and other detectors 31X. The above sensors are respectively electrically connected to the signal acquisition device 200. The above detectors respectively and concurrently diagnose different types of faults, determine the fault type, and send a control instruction with a fault level 1 targeting different fault types to the step-by-step prevention and control execution device 400.

Figure 15:
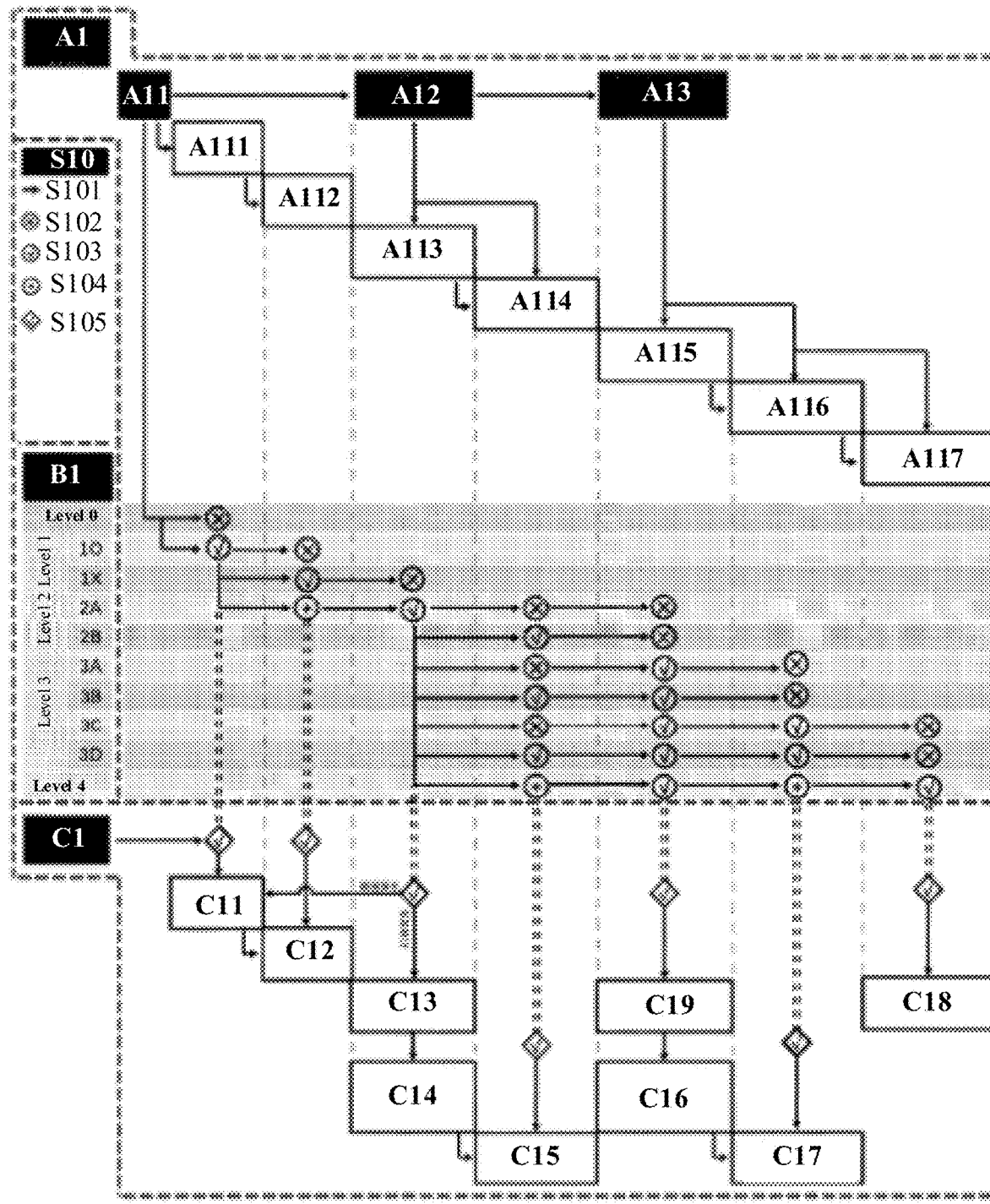
FIG. 15 shows a control logic diagram of a safety prevention and control system of a power battery pack for an electric vehicle in an embodiment.

Referring to FIG. 15, a control logic of the safety prevention and control system 10 of a power battery pack for an electric vehicle is provided. The main controller 300 may include three main layers, namely a fault diagnosis device 310, a cell thermal runaway determination device 320, and a battery pack thermal runaway propagation determination device 330. Each layer corresponds to a different prevention and control measure.

In terms of fault diagnosis, a concurrent fault diagnosis function is provided to diagnose different types of faults and determine the fault type, but no false alarm will occur. Alarms are issued for different faults, and the fault level of the alarms is level 1. When the type of a fault cannot be determined, the fault level is 1O. When the type of a fault is determined, the fault level is 1X, X representing a specific fault type.

In terms of cell thermal runaway determination, a thermal runaway determination function is provided. A thermal runaway occurrence determination device may predict the possibility of thermal runaway of a battery cell within a period of time, t–0, and trigger an alarm mechanism if possible thermal runaway is predicted. If the thermal runaway determination device determines that thermal runaway occurs, an alarm is issued with an alarm level of 2A. At the same time, a zone of cell thermal runaway is determined, and a thermal runaway propagation zone suppression mechanism is activated in a corresponding zone. After the occurrence of thermal runaway in a cell is determined, monitoring is continued to determine whether a thermal runaway fire occurs in the cell. If a fire occurs, the alarm level is 2B, and a zone fire extinguishing mechanism is activated in a corresponding zone.

In terms of battery pack thermal runaway propagation determination, a battery pack thermal runaway propagation determination function is provided. If it is determined that thermal runaway propagation occurs in an adjacent zone of the battery pack but no fire occurs in a cell, the alarm level is 3A. If it is determined that thermal runaway propagation occurs in an adjacent zone of the battery pack and a fire occurs in a cell, the alarm level is 3B. When the alarm level is 3A/3B, a thermal runaway propagation secondary suppression mechanism is activated in a zone where the thermal runaway propagation occurs. At the same time, whether a thermal runaway propagation fire occurs is determined. If it is determined that a thermal runaway propagation fire occurs but no fire occurs in a cell, the alarm level is 3C. If it is determined that a thermal runaway propagation fire occurs and a fire occurs in a cell, the alarm level is 3D. When the alarm level is 3C/3D, a zone secondary fire distinguishing mechanism is activated in a zone where the thermal runaway propagation fire occurs. The controller continuously monitors whether a thermal runaway propagation explosion occurs in the battery pack. If an explosion occurs, the alarm level is 4, and a time interval from thermal runaway of a cell to the explosion of the battery pack (DTR) is recorded. In the passive safety design of the battery system, it should be ensured that the time interval to the explosion (DTR) is greater than an escape time required by a person. Generally, considering that the person is trapped and needs to wait for a fire brigade to break down and rescue, the DTR should be greater than 30 min.

In an embodiment, the disclosure further provides a control method for a safety prevention and control system of a power battery pack for an electric vehicle, with reference to the safety prevention and control system of a power battery pack as mentioned in the above specification and the content in FIG. 1 to FIG. 15. The method may include the following steps.

S100, the signal acquisition device 200 acquires monitoring information of the battery pack 100, and transmits the monitoring information to the main controller 300.

S200, the main controller 300 generates a control instruction according to the monitoring information, and sends the control instruction to the step-by-step prevention and control execution device 400.

S300, the step-by-step prevention and control execution device 400 executes a prevention and control action according to the control instruction sent by the main controller 300.

In an embodiment, the step S200 may include a step S210, in which one or more of the fault diagnosis device 310, the cell thermal runaway determination device 320, and the battery pack thermal runaway propagation determination device 330 generate at least one control instruction according to the monitoring information, and send the at least one control instruction to the step-by-step prevention and control execution device 400.

In an embodiment, the step S210 may include a step S211, in which the internal short-circuit detector 311, the external short-circuit detector 312, the charge and discharge fault detector 313, the insulation failure detector 314, the collision detector 315, the liquid leakage and fire detector 316, and the superheat detector 317 respectively and concurrently diagnose different types of faults, determine the fault type, and send a control instruction with a fault level 1 targeting different fault types to the step-by-step prevention and control execution device 400.

In an embodiment, the control method may further include the electrochemical state determining device 303, the heat generation state determining device 304, the processor 301, the selector 302, and the logic operator 305.

The electrochemical state determining device 303 acquires the information of a battery having an extreme electrochemical state, performs model-based electrochemical abnormal state detection, and outputs a detection result of the electrochemical state of the battery. The heat generation state determining device 304 acquires the information of a battery having an extreme heat generation state, performs model-based heat generation abnormal state detection, and outputs a detection result of the heat generation state of the battery. The processor 301 stores location and state information of the battery pack 100, and generates a control instruction for a prevention and control action. The selector 302 screens an extreme battery based on an "average+difference" model. The logic operator 305 performs a logic operation according to the detection results obtained by the electrochemical state determining device 303 and the heat generation state determining device 304, and outputs an operation result to the processor 301.

In an embodiment, the step S210 may further include the following steps.

S212, the battery cell thermal runaway predictor 321 predicts the possibility of thermal runaway of a battery cell, and the battery cell thermal runaway locator 322 determines a zone where thermal runaway occurs in a battery cell.

S213, the battery cell thermal runaway predictor 321 and the battery cell thermal runaway locator 322 send a control instruction with a fault level 2 to the step-by-step prevention and control execution device 400 based on a different size of the possibility of thermal runaway of a battery cell and a different zone where thermal runaway occurs in a battery cell.

In an embodiment, the step S210 may include the following steps.

S214, the battery pack thermal runaway propagation predictor 331 determines whether thermal runaway propagation occurs in the battery pack and an adjacent zone, and the battery pack thermal runaway propagation locator 332 locates a zone of the battery pack where thermal runaway propagation occurs.

S215, the battery pack thermal runaway propagation predictor 331 and the battery pack thermal runaway propagation locator 332 send a control instruction with a fault level 3 to the step-by-step prevention and control execution device 400 regarding different situations such as whether thermal runaway propagation occurs in the battery pack 100, a zone of the battery pack where the thermal runaway propagation occurs, whether a thermal runaway propagation fire occurs in the battery pack 100, and whether a fire occurs in a battery cell.

In an embodiment, the step S210 may include following steps.

S216, the battery pack thermal runaway propagation fire determination device 333 determines whether a thermal runaway propagation fire occurs in the battery pack 100.

S217, the battery pack thermal runaway propagation explosion determination device 334 determines whether a thermal runaway propagation explosion occurs in the battery pack 100, and if an explosion occurs, sends a control instruction with a fault level 4 to the step-by-step prevention and control execution device 400.

S218, the timer 335 records a time interval from thermal runaway of a battery cell to the explosion of the battery pack 100.

In an embodiment, the control method may further include one or more of the following steps. The disconnecting device 421 disconnects a fault cell and a fault zone circuit. The isolating device 422 isolates the fault cell, isolates a charge and discharge circuit, and disconnects a main circuit of the battery pack 100. The heat flow passive guiding device 431 passively guides the heat flow. The heat flow active guiding device 435 actively guides the heat flow. The heat exchanger 438 realizes heat exchange between the battery pack 100 and the outside. The combustible gas pumping device 439 realizes outward discharge of a combustible gas.

In an embodiment, the fire extinguishing device 440 may include a fire extinguishing agent tank body 441, a fire extinguishing agent conveying line 442, and a fire extinguishing agent spray valve body 443. The fire extinguishing agent tank body 441 and the fire extinguishing agent spray valve body 443 are connected by the fire extinguishing agent conveying line 442. The fire extinguishing agent spray valve body 443 may include a zone I fire extinguishing agent spray valve body 444 and a zone II fire extinguishing agent spray valve body 445.

The control method may further include: the zone I fire extinguishing agent spray valve body 444 and the zone II fire extinguishing agent spray valve body 445 complete a spraying of different doses of a fire extinguishing agent.

In an embodiment, the disclosure further provides a safety prevention and control system of a power battery pack for an electric vehicle. The system may include a battery pack 100, a signal acquisition device 200, a main controller 300, and a step-by-step prevention and control execution device 400. The battery pack 100 powers the electric vehicle.

One end of the signal acquisition device 200 is electrically connected to the battery pack 100, and the other end of the signal acquisition device 200 is electrically connected to the main controller 300, for acquiring monitoring information of the battery pack 100, and transmitting the monitoring information to the main controller 300.

The main controller 300 may include a fault diagnosis device 310, a cell thermal runaway determination device 320, and a battery pack thermal runaway propagation determination device 330. The fault diagnosis device 310, the cell thermal runaway determination device 320, and the battery pack thermal runaway propagation determination device 330 are respectively electrically connected to the step-by-step prevention and control execution device 400 for sending a control instruction to the step-by-step prevention and control execution device 400.

The step-by-step prevention and control execution device 400 may execute a prevention and control action according to the control instruction sent by the fault diagnosis device 310, the cell thermal runaway determination device 320, and the battery pack thermal runaway propagation determination device 330.

The fault diagnosis device 310 may include an internal short-circuit detector 311, an external short-circuit detector 312, a charge and discharge fault detector 313, an insulation failure detector 314, a collision detector 315, a liquid leakage and fire detector 316, and a superheat detector 317.

The internal short-circuit detector 311, the external short-circuit detector 312, the charge and discharge fault detector 313, the insulation failure detector 314, the collision detector 315, the liquid leakage and fire detector 316, and the superheat detector 317 are respectively electrically connected to the signal acquisition device 200.

The internal short-circuit detector 311, the external short-circuit detector 312, the charge and discharge fault detector 313, the insulation failure detector 314, the collision detector 315, the liquid leakage and fire detector 316, and the superheat detector 317 respectively and concurrently diagnose different types of faults, determine the fault type, and send a control instruction with a fault level 1 targeting different fault types to the step-by-step prevention and control execution device 400.

The battery pack thermal runaway propagation determination device 330 may further include a battery pack thermal runaway propagation fire determination device 333, a battery pack thermal runaway propagation explosion determination device 334, and a timer 335.

The battery pack thermal runaway propagation fire determination device 333, the battery pack thermal runaway propagation explosion determination device 334, and the timer 335 are respectively electrically connected to the signal acquisition device 200.

The battery pack thermal runaway propagation fire determination device 333 may determine whether a thermal runaway propagation fire occurs in the battery pack 100.

The battery pack thermal runaway propagation explosion determination device 334 may determine whether a thermal runaway propagation explosion occurs in the battery pack 100, and if an explosion occurs, send a control instruction with a fault level 4 to the step-by-step prevention and control execution device 400.

The timer is 335 electrically connected to the battery pack thermal runaway propagation explosion determination device 334 for recording a time interval from thermal runaway of a battery cell to the explosion of the battery pack 100.

The step-by-step prevention and control execution device 400 may include an alarm device 410, a thermal runaway inducement suppression device 420, a thermal runaway zone suppression device 430, a fire extinguishing device 440, and a safety relief device 450 that are respectively electrically connected to the main controller 300.

The thermal runaway inducement suppression device 420 may include a disconnecting device 421 and an isolating device 422. The disconnecting device 421 and the isolating device 422 are respectively disposed on a device that is to execute a corresponding prevention and control action. The disconnecting device 421 may disconnect a fault cell and a fault zone circuit. The isolating device 422 may isolate the fault cell, isolate a charge and discharge circuit, and disconnect a main circuit of the battery pack 100.

Various embodiments of the disclosure may have one or more of the following effects. The disclosure may provide a safety prevention and control system and control method of a power battery pack for an electric vehicle. The safety prevention and control system of a power battery pack for an electric vehicle may include a signal acquisition device, a main controller, and a step-by-step prevention and control execution device, and may provide an active prevention and control measure and a passive prevention and control measure. The main controller may include a fault diagnosis device, a cell thermal runaway determination device and a battery pack thermal runaway propagation determination device, which are respectively electrically connected to the step-by-step prevention and control execution device to send different control instructions to the step-by-step prevention and control execution device. The step-by-step prevention and control execution device may execute prevention and control actions of different levels according to the different control instructions sent by the fault diagnosis device, the cell thermal runaway determination device, and the battery pack thermal runaway propagation determination device. The safety prevention and control system and control method of a power battery pack for an electric vehicle may accurately start a prevention and control mechanism, maximize a safety protection effect, and ensure the safety of an electric vehicle occupant, according to the actual situation of a specific accident and the prevention and control ability of the prevention and control system. The safety prevention and control system and control method of a power battery pack for an electric vehicle of the disclosure may also make the active prevention and control measure and the passive prevention and control measure complement each other and promote each other. The disclose may provide a safety prevention and control system and control method of a power battery pack for an electric vehicle, which may help to solve the problems that a conventional technical solution cannot actively and directly monitor a battery system fault of the electric vehicle, and cannot comprehensively improve the safety of the battery pack of the electric vehicle.

The above embodiments are merely illustrative of several implementation manners of the disclosure, and the description thereof is more specific and detailed, but is not to be construed as a limitation to the patentable scope of the present invention. It should be pointed out that several variations and improvements can be made by those of ordinary skill in the art without departing from the conception of the disclosure, but such variations and improvements should fall within the protection scope of the disclosure. Therefore, the protection scope of the patent of the disclosure should be subject to the appended claims.

Many different arrangements of the various components depicted, as well as components not shown, are possible without departing from the spirit and scope of the present disclosure. Embodiments of the present disclosure have been described with the intent to be illustrative rather than restrictive. Alternative embodiments will become apparent to those skilled in the art that do not depart from its scope. A skilled artisan may develop alternative means of implementing the aforementioned improvements without departing from the scope of the present disclosure.

It will be understood that certain features and subcombinations are of utility and may be employed without reference to other features and subcombinations and are contemplated within the scope of the claims. Unless indicated otherwise, not all steps listed in the various figures need be carried out in the specific order described.

What is claimed is:

1. A safety prevention and control system (10) of a power battery pack for an electric vehicle, comprising a battery pack (100) for powering the electric vehicle, wherein:
   the safety prevention and control system (10) further comprises a signal acquisition device (200), a main controller (300), and a step-by-step prevention and control execution device (400);
   one end of the signal acquisition device (200) is electrically connected to the battery pack (100) and the other end of the signal acquisition device (200) is electrically connected to the main controller (300) for acquiring monitoring information of the battery pack (100) and transmitting the monitoring information to the main controller (300);
   the main controller (300) comprises a fault diagnosis device (310), a cell thermal runaway determination device (320), and a battery pack thermal runaway propagation determination device (330);
   the fault diagnosis device (310), the cell thermal runaway determination device (320), and the battery pack thermal runaway propagation determination device (330) are respectively electrically connected to the step-by-step prevention and control execution device (400) for sending a control instruction to the step-by-step prevention and control execution device (400);
   the step-by-step prevention and control execution device (400) is configured to execute a prevention and control action according to the control instruction sent by the fault diagnosis device (310), the cell thermal runaway determination device (320), and the battery pack thermal runaway propagation determination device (330);
   the fault diagnosis device (310) comprises an internal short-circuit detector (311), an external short-circuit detector (312), a charge and discharge fault detector (313), an insulation failure detector (314), a collision detector (315), a liquid leakage and fire detector (316), and a superheat detector (317);
   the internal short-circuit detector (311), the external short-circuit detector (312), the charge and discharge fault detector (313), the insulation failure detector (314), the collision detector (315), the liquid leakage and fire detector (316), and the superheat detector (317) are respectively electrically connected to the signal acquisition device (200); and
   the internal short-circuit detector (311), the external short-circuit detector (312), the charge and discharge fault detector (313), the insulation failure detector (314), the collision detector (315), the liquid leakage and fire detector (316), and the superheat detector (317) are respectively configured to concurrently diagnose different types of faults; determine the fault type; and send a control instruction with a fault level 1 targeting different fault types to the step-by-step prevention and control execution device (400).

2. The safety prevention and control system (10) according to claim 1, wherein:
   the internal short-circuit detector (311) comprises a processor (301), a selector (302), an electrochemical state determining device (303), a heat generation state determining device (304), and a logic operator (305);
   one end of the electrochemical state determining device (303) and one end of the heat generation state determining device (304) are respectively connected to the battery pack (100);
   the other end of the electrochemical state determining device (303) and the other end of the heat generation state determining device (304) are respectively connected to the processor (301);
   the electrochemical state determining device (303) is configured to acquire the information of a battery having an extreme electrochemical state, perform model-based electrochemical abnormal state detection, and output a detection result of the electrochemical state of the battery;
   the heat generation state determining device (304) is configured to acquire the information of a battery having an extreme heat generation state, perform model-based heat generation abnormal state detection, and output a detection result of the heat generation state of the battery;
   the processor (301) is configured to store location and state information of the battery pack (100), and the processor (301) is further configured to generate a control instruction for a prevention and control action;
   the selector (302) is configured to screen an extreme battery based on an "average+difference" model; and
   the logic operator (305) is configured to perform a logic operation according to the detection results obtained by the electrochemical state determining device (303) and the heat generation state determining device (304), and output an operation result to the processor (301).

3. The safety prevention and control system (10) according to claim 1, wherein:
   the cell thermal runaway determination device (320) comprises a battery cell thermal runaway predictor (321) and a battery cell thermal runaway locator (322), which are respectively electrically connected to the signal acquisition device (200);

the battery cell thermal runaway predictor (321) is configured to predict a possibility of thermal runaway of a battery cell;

the battery cell thermal runaway locator (322) is configured to determine a zone where thermal runaway occurs in a battery cell; and the battery cell thermal runaway predictor (321) and the battery cell thermal runaway locator (322) are configured to send a control instruction with a fault level 2 to the step-by-step prevention and control execution device (400) based on a different size of the possibility of thermal runaway of a battery cell and a different zone where thermal runaway occurs in a battery cell.

4. The safety prevention and control system (10) according to claim 1, wherein:

the battery pack thermal runaway propagation determination device (330) comprises a battery pack thermal runaway propagation predictor (331) and a battery pack thermal runaway propagation locator (332), which are respectively electrically connected to the signal acquisition device (200);

the battery pack thermal runaway propagation predictor (331) is configured to determine whether thermal runaway propagation occurs in the battery pack and an adjacent zone;

the battery pack thermal runaway propagation locator (332) is configured to locate a zone of the battery pack where thermal runaway propagation occurs; and the battery pack thermal runaway propagation predictor (331) and the battery pack thermal runaway propagation locator (332) are configured to send a control instruction with a fault level 3 to the step-by-step prevention and control execution device (400) regarding different situations such as whether thermal runaway propagation occurs in the battery pack (100), a zone of the battery pack where the thermal runaway propagation occurs, whether a thermal runaway propagation fire occurs in the battery pack (100), and whether a fire occurs in a battery cell.

5. The safety prevention and control system (10) according to claim 1, wherein:

the battery pack thermal runaway propagation determination device (330) further comprises a battery pack thermal runaway propagation fire determination device (333), a battery pack thermal runaway propagation explosion determination device (334), and a timer (335);

the battery pack thermal runaway propagation fire determination device (333), the battery pack thermal runaway propagation explosion determination device (334), and the timer (335) are respectively electrically connected to the signal acquisition device (200);

the battery pack thermal runaway propagation fire determination device (333) is configured to determine whether a thermal runaway propagation fire occurs in the battery pack (100);

the battery pack thermal runaway propagation explosion determination device (334) is configured to determine whether a thermal runaway propagation explosion occurs in the battery pack (100), and if an explosion occurs, send a control instruction with a fault level 4 to the step-by-step prevention and control execution device (400); and the timer (335) is electrically connected to the battery pack thermal runaway propagation explosion determination device (334) for recording a time interval from thermal runaway of a battery cell to the explosion of the battery pack (100).

6. The safety prevention and control system (10) according to claim 1, wherein:

the step-by-step prevention and control execution device (400) comprises an alarm device (410), a thermal runaway inducement suppression device (420), a thermal runaway zone suppression device (430), a fire extinguishing device (440), and a safety relief device (450) that are respectively electrically connected to the main controller (300);

the thermal runaway inducement suppression device (420) comprises a disconnecting device (421) and an isolating device (422);

the disconnecting device (421) and the isolating device (422) are respectively disposed on a device that is to execute a corresponding prevention and control action;

the disconnecting device (421) is configured to disconnect a fault cell and a fault zone circuit; and the isolating device (422) is configured to isolate the fault cell, isolate a charge and discharge circuit, and disconnect a main circuit of the battery pack (100).

7. The safety prevention and control system (10) according to claim 6, wherein:

the thermal runaway zone suppression device (430) comprises a heat flow passive guiding device (431), a heat flow active guiding device (435), a heat exchanger (438), and a combustible gas pumping device (439);

the heat flow passive guiding device (431) is disposed in different zones of the battery pack (100) for passively guiding the heat flow when thermal runaway occurs;

the heat flow active guiding device (435) is disposed in different zones of the battery pack (100) for actively guiding the heat flow when thermal runaway occurs;

the heat exchanger (438) is disposed in different zones of the battery pack (100) for completing heat exchange between the battery pack (100) and the outside; and the combustible gas pumping device (439) is disposed in different zones of the battery pack (100) for completing outward discharge of a combustible gas.

8. The safety prevention and control system (10) according to claim 7, wherein:

the fire extinguishing device (440) comprises a fire extinguishing agent tank body (441), a fire extinguishing agent conveying line (442), and a fire extinguishing agent spray valve body (443);

the fire extinguishing agent tank body (441) and the fire extinguishing agent spray valve body (443) are connected by the fire extinguishing agent conveying line (442);

the fire extinguishing agent spray valve body (443) comprises a zone I fire extinguishing agent spray valve body (444) and a zone II fire extinguishing agent spray valve body (445); and the zone I fire extinguishing agent spray valve body (444) and the zone II fire extinguishing agent spray valve body (445) are configured to complete a spraying of different doses of a fire extinguishing agent.

9. The safety prevention and control system (10) according to claim 1, wherein the main controller (300) and the step-by-step prevention and control execution device (400) are in network communication.

10. A control method for a safety prevention and control system of a power battery pack for an electric vehicle, comprising the steps of:

S100, acquiring, by a signal acquisition device (200), a monitoring information of a battery pack (100), and transmitting the monitoring information to a main controller (300);

S200, generating, by a main controller (300), a control instruction according to the monitoring information, and sending the control instruction to a step-by-step prevention and control execution device (400); and S300, executing, by the step-by-step prevention and control execution device (400), a prevention and control action according to the control instruction sent by the main controller (300); and the step S200 comprises: S210, generating, by one or more of a fault diagnosis device (310), a cell thermal runaway determination device (320), and a battery pack thermal runaway propagation determination device (330), at least one control instruction according to the monitoring information, and sending the at least one control instruction to a step-by-step prevention and control execution device (400); and the step S210 comprises:

S211, concurrently diagnosing, by an internal short-circuit detector (311), an external short-circuit detector (312), a charge and discharge fault detector (313), an insulation failure detector (314), a collision detector (315), a liquid leakage and fire detector (316), and a superheat detector (317), different types of faults;

determining the fault type; and sending a control instruction with a fault level 1 targeting different fault types to the step-by-step prevention and control execution device (400);

wherein the safety prevention and control system (10) comprises:

the battery pack (100) for powering the electric vehicle;

the signal acquisition device (200) with one end being electrically connected to the battery pack (100);

the main controller (300), wherein the main controller (300) is electrically connected to the other end of the signal acquisition device (200); and the step-by-step prevention and control execution device (400), electrically connected to the main controller (300); and wherein:

the main controller (300) comprises the fault diagnosis device (310), the cell thermal runaway determination device (320), and the battery pack thermal runaway propagation determination device (330);

the fault diagnosis device (310), the cell thermal runaway determination device (320), and the battery pack thermal runaway propagation determination device (330) are respectively electrically connected to the step-by-step prevention and control execution device (400);

the fault diagnosis device (310) comprises the internal short-circuit detector (311), the external short-circuit detector (312), the charge and discharge fault detector (313), the insulation failure detector (314), the collision detector (315), the liquid leakage and fire detector (316), and the superheat detector (317); and the internal short-circuit detector (311), the external short-circuit detector (312), the charge and discharge fault detector (313), the insulation failure detector (314), the collision detector (315), the liquid leakage and fire detector (316), and the superheat detector (317) are respectively electrically connected to the signal acquisition device (200).

11. The control method according to claim 10, wherein:
the control method further comprises:

acquiring, by an electrochemical state determining device (303), the information of a battery having an extreme electrochemical state, performing model-based electrochemical abnormal state detection, and outputting a detection result of the electrochemical state of the battery;

acquiring, by a heat generation state determining device (304), the information of a battery having an extreme heat generation state, performing model-based heat generation abnormal state detection, and outputting a detection result of the heat generation state of the battery;

storing, by a processor (301), a location and state information of a battery pack (100), and generating a control instruction for a prevention and control action;

screening, by a selector (302), an extreme battery based on an "average+difference" model; and performing, by a logic operator (305), a logic operation according to the detection results obtained by an electrochemical state determining device (303) and a heat generation state determining device (304), and outputting an operation result to a processor (301); and wherein:

the internal short-circuit detector (311) comprises the processor (301), the selector (302), the electrochemical state determining device (303), the heat generation state determining device (304), and the logic operator (305);

one end of the electrochemical state determining device (303) and one end of the heat generation state determining device (304) are respectively connected to the battery pack (100); and the other end of the electrochemical state determining device (303) and the other end of the heat generation state determining device (304) are respectively connected to the processor (301).

12. The control method according to claim 10, wherein:
the step S210 comprises:

S212, predicting, by a battery cell thermal runaway predictor (321), a possibility of thermal runaway of a battery cell, and determining, by a battery cell thermal runaway locator (322), a zone where thermal runaway occurs in a battery cell; and S213, sending, by the battery cell thermal runaway predictor (321) and the battery cell thermal runaway locator (322), a control instruction with a fault level 2 to a step-by-step prevention and control execution device (400) based on a different size of the possibility of thermal runaway of a battery cell and a different zone where thermal runaway occurs in a battery cell; and wherein:

the cell thermal runaway determination device (320) comprises the battery cell thermal runaway predictor (321) and the battery cell thermal runaway locator (322), which are respectively electrically connected to the signal acquisition device (200).

13. The control method according to claim 10, wherein:
the step S210 comprises:

S214, determining, by a battery pack thermal runaway propagation predictor (331), whether thermal runaway propagation occurs in the battery pack and an adjacent zone, and locating, by a battery pack thermal runaway propagation locator (332), a zone of the battery pack where thermal runaway propagation occurs; and S215, sending, by the battery pack thermal runaway propagation predictor (331) and the battery pack thermal runaway propagation locator (332), a control instruction with a fault level 3 to the step-by-step prevention and control execution device (400) regarding different situations such as whether thermal runaway propagation occurs in the battery pack (100), a zone of the battery pack where the thermal runaway propagation occurs, whether a thermal runaway propagation fire occurs in the battery pack (100), and whether a fire occurs in a battery cell; and wherein:

the battery pack thermal runaway propagation determination device (330) comprises the battery pack thermal runaway propagation predictor (331) and the battery pack thermal runaway propagation locator (332), which are respectively electrically connected to the signal acquisition device (200).

14. The control method according to claim 10, wherein: the step S210 comprises:

S216, determining, by a battery pack thermal runaway propagation fire determination device (333), whether a thermal runaway propagation fire occurs in the battery pack (100);

S217, determining, by a battery pack thermal runaway propagation explosion determination device (334), whether a thermal runaway propagation explosion occurs in the battery pack (100), and if an explosion occurs, sending a control instruction with a fault level 4 to the step-by-step prevention and control execution device (400); and S218, recording, by a timer (335), a time interval from thermal runaway of a battery cell to the explosion of the battery pack (100); and wherein:

the battery pack thermal runaway propagation determination device (330) further comprises the battery pack thermal runaway propagation fire determination device (333), the battery pack thermal runaway propagation explosion determination device (334), and the timer (335); and the battery pack thermal runaway propagation fire determination device (333), the battery pack thermal runaway propagation explosion determination device (334), and the timer (335) are respectively electrically connected to the signal acquisition device (200), and the timer (335) is electrically connected to the battery pack thermal runaway propagation explosion determination device (334).

15. The control method according to claim 10, wherein: the control method further comprises one or more of the following steps:

disconnecting, by a disconnecting device (421), a fault cell and a fault zone circuit;

isolating, by an isolating device (422), the fault cell, isolating a charge and discharge circuit, and disconnecting a main circuit of the battery pack (100);

passively guiding, by a heat flow passive guiding device (431), the heat flow;

actively guiding, by a heat flow active guiding device (435), the heat flow;

realizing, by a heat exchanger (438), heat exchange between the battery pack (100) and the outside; and realizing, by a combustible gas pumping device (439), outward discharge of a combustible gas; and wherein:

the step-by-step prevention and control execution device (400) comprises an alarm device (410), a thermal runaway inducement suppression device (420), a thermal runaway zone suppression device (430), a fire extinguishing device (440), and a safety relief device (450) that are respectively electrically connected to the main controller (300);

the thermal runaway inducement suppression device (420) comprises a disconnecting device (421) and an isolating device (422); the disconnecting device (421) and the isolating device (422) are respectively disposed on a device that is to execute a corresponding prevention and control action; and the thermal runaway zone suppression device (430) comprises the heat flow passive guiding device (431), the heat flow active guiding device (435), the heat exchanger (438), and a combustible gas pumping device (439); the heat flow passive guiding device (431) is disposed in different zones of the battery pack (100), the heat flow active guiding device (435) is disposed in different zones of the battery pack (100), the heat exchanger (438) is disposed in different zones of the battery pack (100), and the combustible gas pumping device (439) is disposed in different zones of the battery pack (100).

16. The control method according to claim 15, wherein: the control method further comprises:

spraying, by a zone I fire extinguishing agent spray valve body (444) and a zone II fire extinguishing agent spray valve body (445), different doses of a fire extinguishing agent; and wherein:

the fire extinguishing device (440) comprises a fire extinguishing agent tank body (441), a fire extinguishing agent conveying line (442), and a fire extinguishing agent spray valve body (443);

the fire extinguishing agent tank body (441) and the fire extinguishing agent spray valve body (443) are connected by the fire extinguishing agent conveying line (442); and the fire extinguishing agent spray valve body (443) comprises the zone I fire extinguishing agent spray valve body (444) and the zone II fire extinguishing agent spray valve body (445).

17. A safety prevention and control system (10) of a power battery pack for an electric vehicle, comprising a battery pack (100), a signal acquisition device (200), a main controller (300), and a step-by-step prevention and control execution device (400), wherein:

the battery pack is (100) configured to power the electric vehicle;

one end of the signal acquisition device (200) is electrically connected to the battery pack (100) and the other end of the signal acquisition device (200) is electrically connected to the main controller (300) for acquiring monitoring information of the battery pack (100) and transmitting the monitoring information to the main controller (300);

the main controller (300) comprises a fault diagnosis device (310), a cell thermal runaway determination device (320), and a battery pack thermal runaway propagation determination device (330);

the fault diagnosis device (310), the cell thermal runaway determination device (320), and the battery pack thermal runaway propagation determination device (330) are respectively electrically connected to the step-by-step prevention and control execution device (400) for sending a control instruction to the step-by-step prevention and control execution device (400);

the step-by-step prevention and control execution device (400) is configured to execute a prevention and control action according to the control instruction sent by the fault diagnosis device (310), the cell thermal runaway determination device (320), and the battery pack thermal runaway propagation determination device (330);

the fault diagnosis device (310) comprises an internal short-circuit detector (311), an external short-circuit detector (312), a charge and discharge fault detector (313), an insulation failure detector (314), a collision detector (315), a liquid leakage and fire detector (316), and a superheat detector (317);

the internal short-circuit detector (311), the external short-circuit detector (312), the charge and discharge fault detector (313), the insulation failure detector (314), the collision detector (315), the liquid leakage and fire detector (316), and the superheat detector (317) are respectively electrically connected to the signal acquisition device (200);

the internal short-circuit detector (311), the external short-circuit detector (312), the charge and discharge fault detector (313), the insulation failure detector (314), the collision detector (315), the liquid leakage and fire detector (316), and the superheat detector (317) are respectively configured to concurrently diagnose different types of faults; determine the fault type; and send a control instruction with a fault level 1 targeting different fault types to the step-by-step prevention and control execution device (400);

the battery pack thermal runaway propagation determination device (330) further comprises a battery pack thermal runaway propagation fire determination device (333), a battery pack thermal runaway propagation explosion determination device (334), and a timer (335);

the battery pack thermal runaway propagation fire determination device (333), the battery pack thermal runaway propagation explosion determination device (334), and the timer (335) are respectively electrically connected to the signal acquisition device (200);

the battery pack thermal runaway propagation fire determination device (333) is configured to determine whether a thermal runaway propagation fire occurs in the battery pack (100);

the battery pack thermal runaway propagation explosion determination device (334) is configured to determine whether a thermal runaway propagation explosion occurs in the battery pack (100), and if an explosion occurs, send a control instruction with a fault level 4 to the step-by-step prevention and control execution device (400);

the timer (335) is electrically connected to the battery pack thermal runaway propagation explosion determination device (334) for recording a time interval from thermal runaway of a battery cell to the explosion of the battery pack (100);

the step-by-step prevention and control execution device (400) comprises an alarm device (410), a thermal runaway inducement suppression device (420), a thermal runaway zone suppression device (430), a fire extinguishing device (440), and a safety relief device (450) that are respectively electrically connected to the main controller (300);

the thermal runaway inducement suppression device (420) comprises a disconnecting device (421) and an isolating device (422);

the disconnecting device (421) and the isolating device (422) are respectively disposed on a device that is to execute a corresponding prevention and control action;

the disconnecting device (421) is configured to disconnect a fault cell and a fault zone circuit; and the isolating device (422) is configured to isolate the fault cell, isolate a charge and discharge circuit, and disconnect a main circuit of the battery pack (100).

\* \* \* \* \*